US012674235B2

(12) United States Patent
Takebayashi et al.

(10) Patent No.: US 12,674,235 B2
(45) Date of Patent: Jul. 7, 2026

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Yuji Takebayashi, Toyama (JP); Kenji Ono, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 784 days.

(21) Appl. No.: 17/587,871

(22) Filed: Jan. 28, 2022

(65) Prior Publication Data

US 2022/0145465 A1      May 12, 2022

Related U.S. Application Data

(63) Continuation of application No. PCT/JP2019/037292, filed on Sep. 24, 2019.

(51) Int. Cl.
| | |
|---|---|
| *C23C 16/52* | (2006.01) |
| *C23C 16/44* | (2006.01) |
| *C23C 16/458* | (2006.01) |
| *H10P 72/76* | (2026.01) |

(52) U.S. Cl.
CPC .......... *C23C 16/52* (2013.01); *C23C 16/4412* (2013.01); *C23C 16/4583* (2013.01); *H10P 72/7618* (2026.01)

(58) Field of Classification Search
CPC .................... C23C 16/45551; H01L 21/68764
See application file for complete search history.

(56) References Cited

U.S. PATENT DOCUMENTS

| | | | |
|---|---|---|---|
| 2003/0194493 A1* | 10/2003 | Chang | C23C 16/45519 156/345.31 |
| 2008/0261412 A1 | 10/2008 | Yoon et al. | |
| 2012/0225191 A1 | 9/2012 | Yudovsky et al. | |
| 2013/0092085 A1 | 4/2013 | Lee | |

(Continued)

FOREIGN PATENT DOCUMENTS

| | | |
|---|---|---|
| CN | 208697131 U | 4/2019 |
| JP | 2010-525162 A | 7/2010 |

(Continued)

OTHER PUBLICATIONS

Taiwanese Office Action, Taiwanese Patent Application No. 109120536 dated Jan. 12, 2021, 16 pgs.

(Continued)

*Primary Examiner* — Joseph A Miller, Jr.
(74) *Attorney, Agent, or Firm* — Volpe Koenig

(57) ABSTRACT
There is provided a technique that includes: a process container in which a substrate is processed; a support configured to support the substrate in the process container; a gas flow controller configured to form a gas flow capable of making contact with the substrate in the process container; a first actuator configured to allow the support to reciprocate in the process container; and a second actuator configured to allow the gas flow controller to reciprocate in the process container in a direction opposite to a moving direction of the support.

17 Claims, 11 Drawing Sheets

(56) References Cited

U.S. PATENT DOCUMENTS

| | | | |
|---|---|---|---|
| 2015/0167164 A1* | 6/2015 | Jauhiainen | ........ C23C 16/45563 |
| | | | 427/255.28 |
| 2015/0307988 A1 | 10/2015 | Saido et al. | |
| 2015/0368798 A1 | 12/2015 | Kwong | |
| 2018/0265982 A1 | 9/2018 | Spath et al. | |

FOREIGN PATENT DOCUMENTS

| | | | |
|---|---|---|---|
| JP | 2014-508224 A | 4/2014 |
| JP | 2015-209557 A | 11/2015 |
| JP | 2016-511797 A | 4/2016 |
| TW | 201541535 A | 11/2015 |

OTHER PUBLICATIONS

International Search Report, PCT/JP2019/037292, dated Dec. 24, 2019, 7 pgs.
Japanese Office Action issued on Jun. 21, 2022 for Japanese Patent Application No. 2021-548002.

* cited by examiner

FIG. 3

S111 : Home position (A)

S112 : Acceleration

S113 : Constant speed
(film-forming process)

S114 : Deceleration

S115 : Home position (B)

L1

200   300

Home position (A)

Acceleration

Constant speed
(film-forming process)

Deceleration

Home position (B)

L2

L3

FIG. 6A
Processing one wafer
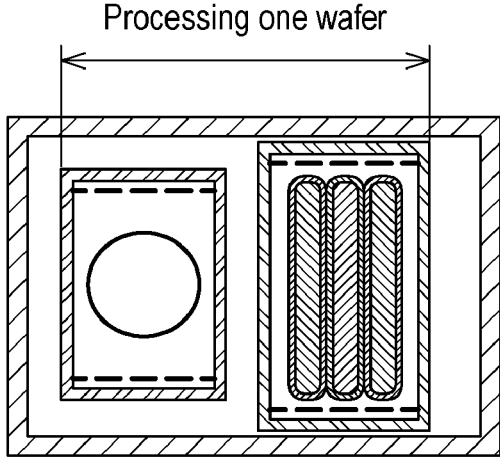
FIG. 6B
Processing two
wafers simultaneously
FIG. 6C
Processing four
wafers simultaneously
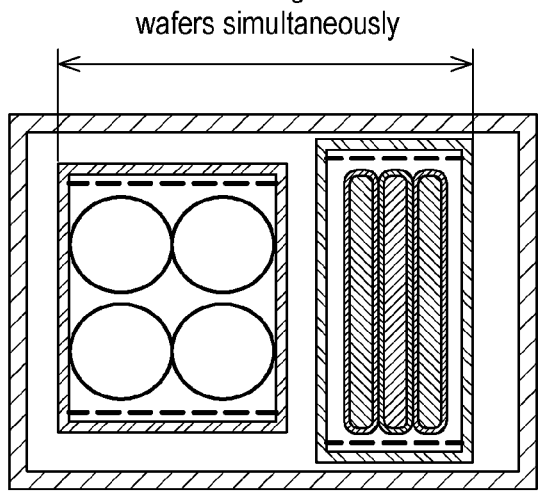

FIG. 7B

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a Bypass Continuation application of PCT International Application No. PCT/JP2019/037292, filed Sep. 24, 2019, the disclosure of which is incorporated herein in its entirety by reference.

TECHNICAL FIELD

The present disclosure relates to a substrate processing apparatus, a method of manufacturing a semiconductor device, and a recording medium.

BACKGROUND

Generally, in a semiconductor device manufacturing process, a substrate processing apparatus configured to perform a predetermined processing process on a substrate such as a wafer or the like is used. As the processing process, for example, there is a film-forming process in which a plurality of types of gases are sequentially supplied. The substrate processing apparatus configured to perform such a processing process includes, for example, an apparatus configured to perform film formation or the like on a substrate by relatively moving a substrate position and a gas supply position through a linear motion of either a cartridge configured to supply a gas or a substrate mounting stand configured to support a substrate in a process container.

In the substrate processing apparatus including the above-described configuration, a retraction space for the cartridge or the substrate mounting stand may be secured in the process container before start of the linear motion and after end of the linear motion. Therefore, a volume of the process container may be increased, and a footprint (occupation area) of the substrate processing apparatus may be increased accordingly.

SUMMARY

Some embodiments of the present disclosure provide a technique capable of reducing a volume of a process container and a footprint of a substrate processing apparatus.

According to some embodiments of the present disclosure, there is provided a technique that includes: a process container in which a substrate is processed; a support configured to support the substrate in the process container; a gas flow controller configured to form a gas flow capable of making contact with the substrate in the process container; a first actuator configured to allow the support to reciprocate in the process container; and a second actuator configured to allow the gas flow controller to reciprocate in the process container in a direction opposite to a moving direction of the support.

BRIEF DESCRIPTION OF DRAWINGS

The accompanying drawings, which are incorporated in and constitute the specification, illustrate some embodiments of the present disclosure.

FIGS. 1A to 1C are conceptual views showing a schematic configuration example of a substrate processing apparatus used in a first embodiment of the present disclosure, wherein FIG. 1A is a plane view showing a cross section taken along a line A-A, FIG. 1B is a side view showing a cross section taken along a line B-B, and FIG. 1C is a front view showing a cross section taken along a line C-C.

FIGS. 2A and 2B are conceptual views showing a gas cartridge head assembly in a substrate processing apparatus used in the first embodiment of the present disclosure, wherein FIG. 2A is a side sectional view schematically showing an outline of a configuration example, and FIG. 2B is a cross sectional view showing a cross section of a main component.

FIG. 3 is a flowchart showing a procedure of a substrate processing step according to the first embodiment of the present disclosure.

FIGS. 5A to 5C are explanatory views of comparing movement ranges of the relative position movement processing operation, wherein FIG. 5A is a view showing a movement range according to the first embodiment of the present disclosure, FIG. 5B is a view showing a movement range in Comparative Example 1, and FIG. 5C is a view showing a movement range in Comparative Example 2.

FIGS. 6A to 6C are conceptual views showing an example of wafer arrangement in a substrate processing apparatus used in a second embodiment of the present disclosure, wherein FIG. 6A is a plane view showing a configuration example of processing a single wafer, FIG. 6B is a plane view showing a configuration example of processing two wafers at the same time, and FIG. 6C is a plane view showing a configuration example of processing four wafers at the same time.

FIGS. 7A and 7B are conceptual views showing a gas cartridge head assembly of a substrate processing apparatus used in a third embodiment of the present disclosure, wherein FIG. 7A is a side sectional view schematically showing an outline of a configuration example, and FIG. 7B is a cross sectional view showing a cross section of a main component.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components are not described in detail so as not to unnecessarily obscure aspects of the various embodiments.

Hereinafter, some embodiments of the present disclosure will be described with reference to the drawings.

A substrate processing apparatus given as an example in the following description is used in a semiconductor device manufacturing process and is configured to perform a predetermined processing process on a substrate to be processed.

The substrate to be processed is, for example, a silicon wafer (hereinafter, simply referred to as "wafer") as a semiconductor substrate into which a semiconductor device is built. When the term "wafer" is used herein, it may refer to "a wafer itself" or "a laminated body (aggregate) of a wafer and a predetermined layer or film formed on a surface of the wafer (In other words, the term "wafer" may include a predetermined layer or film formed on the surface of the wafer)." When the phrase "a surface of a wafer" is used herein, it may refer to "a surface (exposed surface) of a wafer itself" or "a surface of a predetermined layer or film formed on a wafer, that is, an outermost surface of a wafer as a laminated body." When the term "substrate" is used herein, it may be synonymous with the term "wafer."

Examples of the predetermined processing process (hereinafter, sometimes simply referred to as "process") performed on the wafer include an oxidation process, a diffusion process, an annealing process, an etching process, a pre-cleaning process, a chamber cleaning process, a film-forming process, and the like. In some embodiments, a case where a film-forming process is performed will be taken as an example.

First Embodiment

First, a first embodiment of the present disclosure will be specifically described.

(1) Configuration of Substrate Processing Apparatus

Figure 1A:
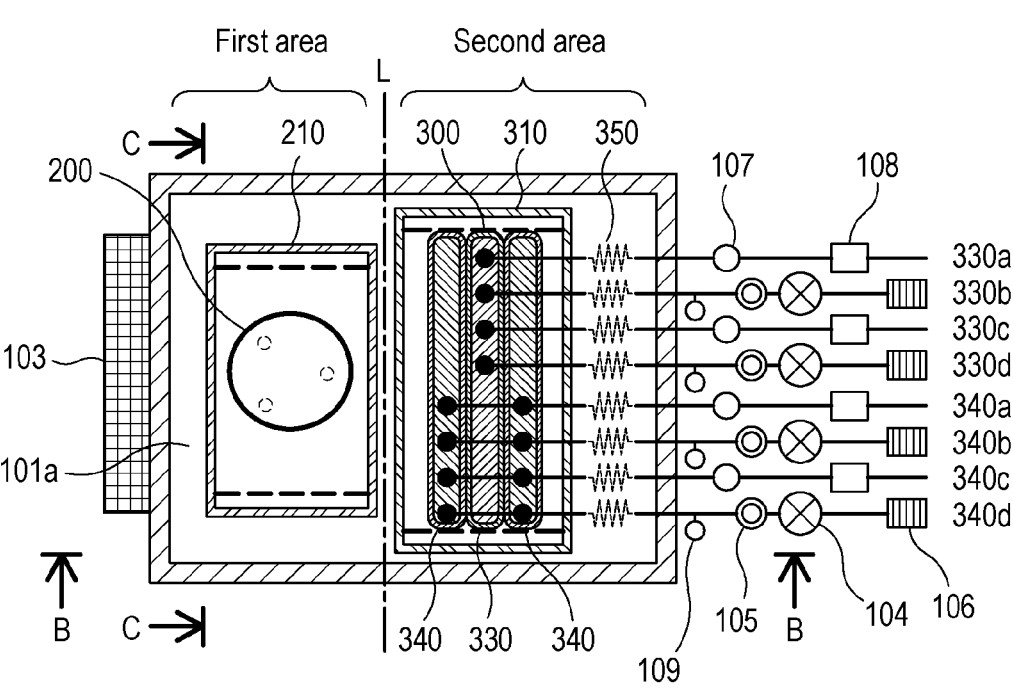
Figure 1B:
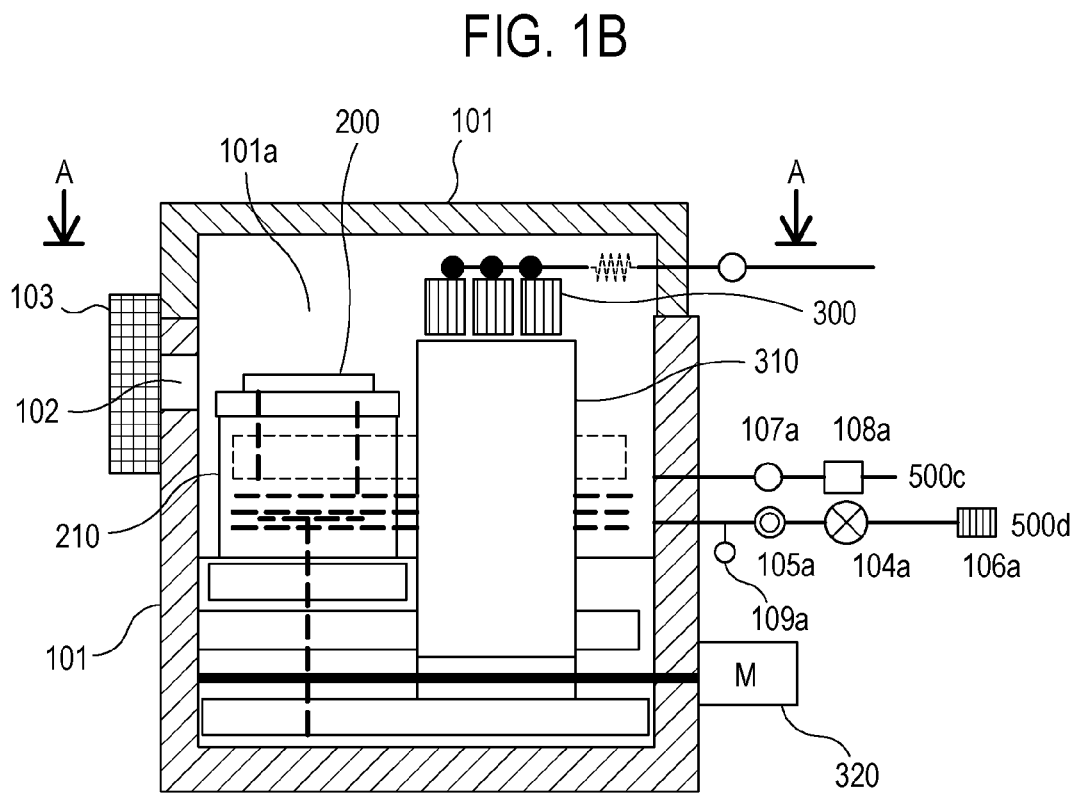
Figure 1C:
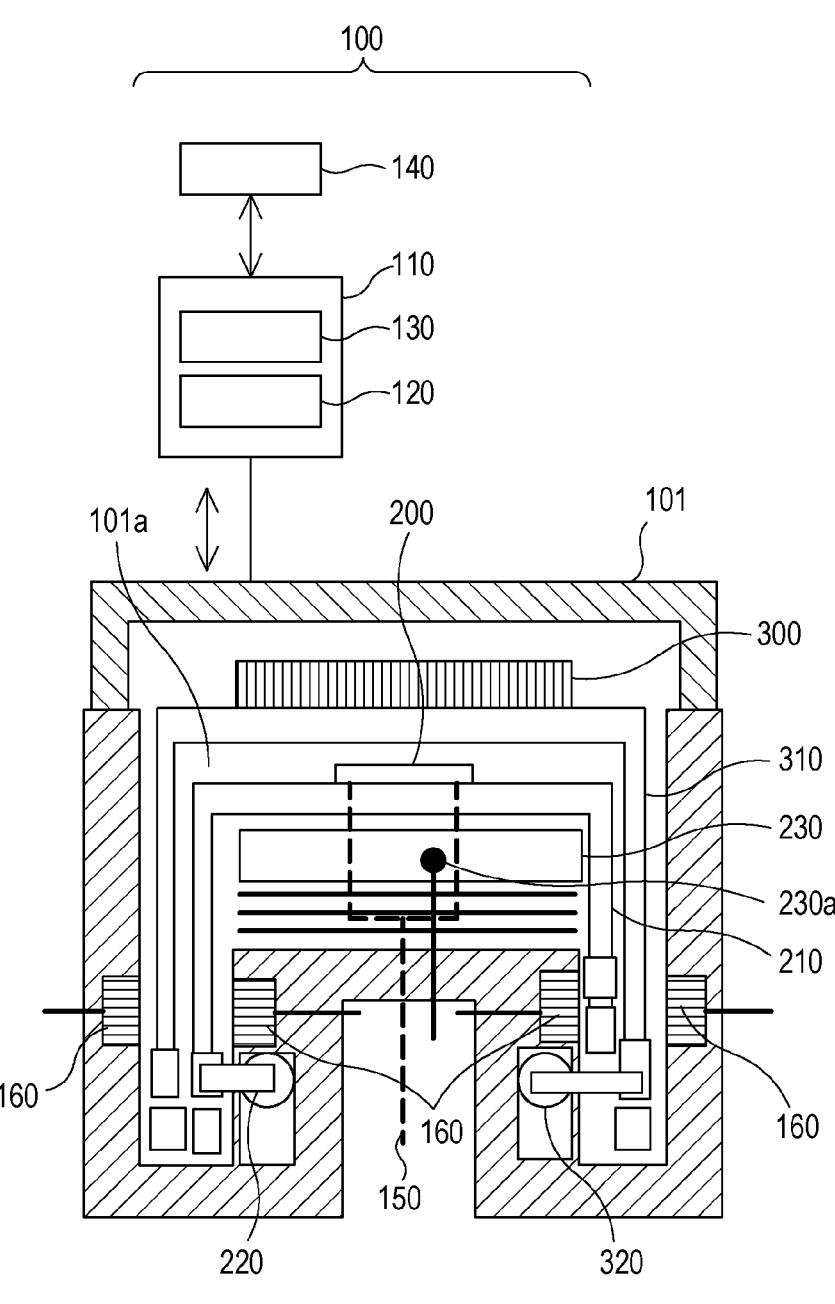

FIGS. 1A to 1C are conceptual views showing a schematic configuration example of a substrate processing apparatus used in a first embodiment of the present disclosure, wherein FIG. 1A is a plane view showing a cross section taken along a line A-A, FIG. 1B is a side view showing a cross section taken along a line B-B, and FIG. 1C is a front view showing a cross section taken along a line C-C.

Process Container

The substrate processing apparatus 100 includes a process container 101 configured to process a wafer 200. The process container 101 is configured as a closed container made of a metal material, for example, aluminum (Al) or stainless steel (SUS). Inside the process container 101, that is, in a hollow portion of the process container 101, there is formed a process chamber 101a as a process space in which the wafer 200 is processed. A wafer loading/unloading port 102 and a gate valve 103 configured to open and close the wafer loading/unloading port 102 are installed at a side wall (side surface) of the process container 101 such that the wafer 200 may be transferred into and out of the process container 101 via the wafer loading/unloading port 102.

The process container 101 includes a plurality of areas partitioned into areas on one end side and areas on the other end side in the process container 101. Specifically, as shown in FIG. 1A, the process container 101 of a rectangular shape in the plane view includes a first area and a second area, which are two areas partitioned by a virtual straight line L. The first area corresponds to the area on one end side in the process container 101 and is a space on a side in the process container 101 where the gate valve 103 is installed. The second area corresponds to an area on the other end side in the process container 101 and is a space on a side opposite to the side in the process container 101 where the gate valve 103 is installed. That is, the first area is a space between the straight line L and the side wall (inner wall) of the process container 101 where the gate valve 103 is installed in the plane view, and the second area is a space between the straight line L and the side wall (inner wall) facing the side wall of the process container 101 where the gate valve 103 is installed in the plane view. The first area and the second area are in fluid communication with each other, and there is no partition plate or the like between the first area and the second area. Further, the first area and the second area are arranged adjacent to each other without interposing another area therebetween. The straight line L that divides the first area and the second area in this way may be assumed to, for example, divide the rectangular region in the process container 101 into equal regions. For example, the straight line L may be assumed to form a perpendicular bisector of a long side of an outward form of the process container 101 of a rectangular shape in the plane view. In that case, the first area and the second area have the same volume, and have the same shape, the same width, and the same area in the plane view. However, the present disclosure is not limited thereto, and the straight line L may be assumed to cause a difference between the first area and the second area.

Gas Supplier/Exhauster

A gas supplier as a gas supply system configured to supply a gas into the process container 101 and an exhauster as an exhaust system configured to exhaust a gas from the inside of the process container 101 are connected to the process container 101. The gas supplier includes a first gas supplier and a second gas supplier installed separately from the first gas supplier. Further, the exhauster includes a first exhauster and a second exhauster installed separately from the first exhauster.

The first gas supplier and the first exhauster are connected to the process container 101 via a cartridge head 300 as a gas flow controller described later.

Specifically, exhaust lines (exhaust pipes) 330b, 330d, 340b and 340d are connected to the process container 101 via the cartridge head 300. A pressure sensor 109, a pressure controller 105 such as an APC (Auto Pressure Controller) valve, an exhaust valve 104 and a vacuum pump 106 are connected to each of the exhaust lines 330b, 330d, 340b and 340d, sequentially from an upstream side of a gas flow. The first exhauster mainly includes the exhaust lines 330b, 330d, 340b and 340d, the pressure sensor 109, the pressure controller 105 and the exhaust valve 104. The vacuum pump 106 may be included in the first exhauster.

Further, gas supply lines (supply pipes) 330a, 330c, 340a and 340c are connected to the process container 101 via the cartridge head 300. A mass flow controller (MFC) 108 and a valve 107 are connected to each of the gas supply lines 330a, 330c, 340a and 340c, sequentially from an upstream side of a gas flow. A first gas supplier mainly includes the gas supply lines 330a, 330c, 340a and 340c, the MFC 108 and the valve 107.

Pressure in the exhaust lines 330b, 330d, 340b and 340d is measured by the pressure sensor 109. The pressure controller 105 is feedback-controlled based on the measured pressure information such that the pressure in the exhaust lines 330b, 330d, 340b and 340d may be regulated to be a predetermined pressure.

A second gas supplier and a second exhauster are installed separately from the first gas supplier and the first exhauster described above.

Specifically, as shown in FIG. 1B, an exhaust line 500d different from the above-described exhaust lines 330b, 330d, 340b and 340d is installed at the process container 101. The exhaust line 500d is directly connected to the side wall of the process container 101. A pressure sensor 109a, a pressure controller 105a such as an APC valve, an exhaust valve 104a and a vacuum pump 106a are connected to the exhaust line 500d, sequentially from an upstream side of a gas flow. A second exhauster mainly includes the exhaust line 500d, the pressure sensor 109a, the pressure controller 105a and the exhaust valve 104a. The vacuum pump 106a may be included in the second exhauster.

Further, a gas supply line 500c different from the gas supply lines 330a, 330c, 340a and 340c described above is installed at the process container 101. The gas supply line 500c is directly connected to the side wall of the process container 101. An MFC 108a and a valve 107a are connected to the gas supply line 500c, sequentially from an upstream side of a gas flow. The second gas supplier mainly includes the gas supply line 500c, the MFC 108a and the valve 107a.

The pressure inside the process container 101 is measured by a pressure sensor 109a. The pressure controller 105 is feedback-controlled based on the measured pressure information such that the pressure inside the process container 101 can be regulated to be a predetermined pressure.

Substrate Mounting Stand

Inside the process container 101, a substrate mounting stand 210 is installed as a support (support stand) on which a wafer 200 is mounted and supported. The substrate mounting stand 210 is formed in a portal shape in a front view as shown in FIGS. 1C and 1s formed in a rectangular shape in a plane view as shown in FIG. 1A. The wafer 200 is mounted and supported on an upper surface (substrate mounting surface) of an upper end portion of the substrate mounting stand 210.

A slide mechanism 220 as a first actuator, which will be described later, is connected to a lower end portion of the substrate mounting stand 210. As a result, the substrate mounting stand 210 that supports the wafer 200 may reciprocate between one end side and the other end side in the process container 101, that is, between a first area and a second area.

Further, below the substrate mounting stand 210, a heater 230 is installed as a heating source configured to heat the wafer 200. The heater 230 is fixed to a bottom of the process container 101 without reciprocating like the substrate mounting stand 210 and is installed to straddle both the first area and the second area. A state of supplying electric power to the heater 230 is feedback-controlled based on temperature information detected by a temperature sensor 230a installed in the vicinity of the wafer 200. As a result, the heater 230 is configured to be capable of maintaining the temperature of the wafer 200 supported on the substrate mounting stand 210 at a predetermined temperature.

Since the substrate mounting surface of the substrate mounting stand 210 comes into direct contact with the wafer 200, the substrate mounting surface may be made of a material, for example, quartz ($SiO_2$), alumina ($Al_2O_3$) or the like. For example, a susceptor as a support plate made of quartz, alumina or the like may be mounted on the substrate mounting surface of the substrate mounting stand 210, and the wafer 200 may be mounted and supported on the susceptor.

Processing Gas Cartridge Head Assembly

Inside the process container 101, a processing gas cartridge head assembly (hereinafter simply referred to as "cartridge head") 300 is installed as a gas flow controller that forms a gas flow capable of making contact with the wafer 200 on the substrate mounting stand 210. The first gas supplier and the first exhauster described above are connected to the cartridge head 300 to form a gas flow capable of making contact with the wafer 200.

The cartridge head 300 is supported by a cartridge head mounting stand 310. The cartridge head mounting stand 310 is formed in the portal shape in the front view as shown in FIGS. 1C and 1s formed in the rectangular shape in the plane view as shown in FIG. 1A. The cartridge head 300 is supported by the upper end portion of the cartridge head mounting stand 310.

A slide mechanism 320 as a second actuator, which will be described later, is connected to the lower end portion of the cartridge head mounting stand 310. As a result, the cartridge head mounting stand 310 that supports the cartridge head 300 may reciprocate between the second area and the first area.

The cartridge head 300 supported by the cartridge head mounting stand 310 such that the cartridge head 300 may reciprocate includes a precursor gas cartridge 330 as a precursor gas flow controller, and reaction gas cartridges 340 as reaction gas flow controllers. The precursor gas cartridge 330 and the reaction gas cartridges 340 are arranged so that the reaction gas cartridges 340 are located on both sides of the precursor gas cartridge 330. That is, the reaction gas cartridges 340 are arranged to sandwich the precursor gas cartridge 330 on both sides in a movement direction of the cartridge head 300. As a result, the cartridge head 300 is configured such that when the cartridge head 300 moves relative to the wafer 200, the wafer 200 is finally exposed to the reaction gas supplied from the reaction gas cartridge 340 to finish the film-forming process. The film-forming process refers to a process in which a thin film is formed on the surface of the wafer 200 by allowing the precursor gas or the reaction gas to be adsorbed on the surface of the wafer 200 and allowing the other gas to make contact with the adsorbed gas.

Figure 2A:
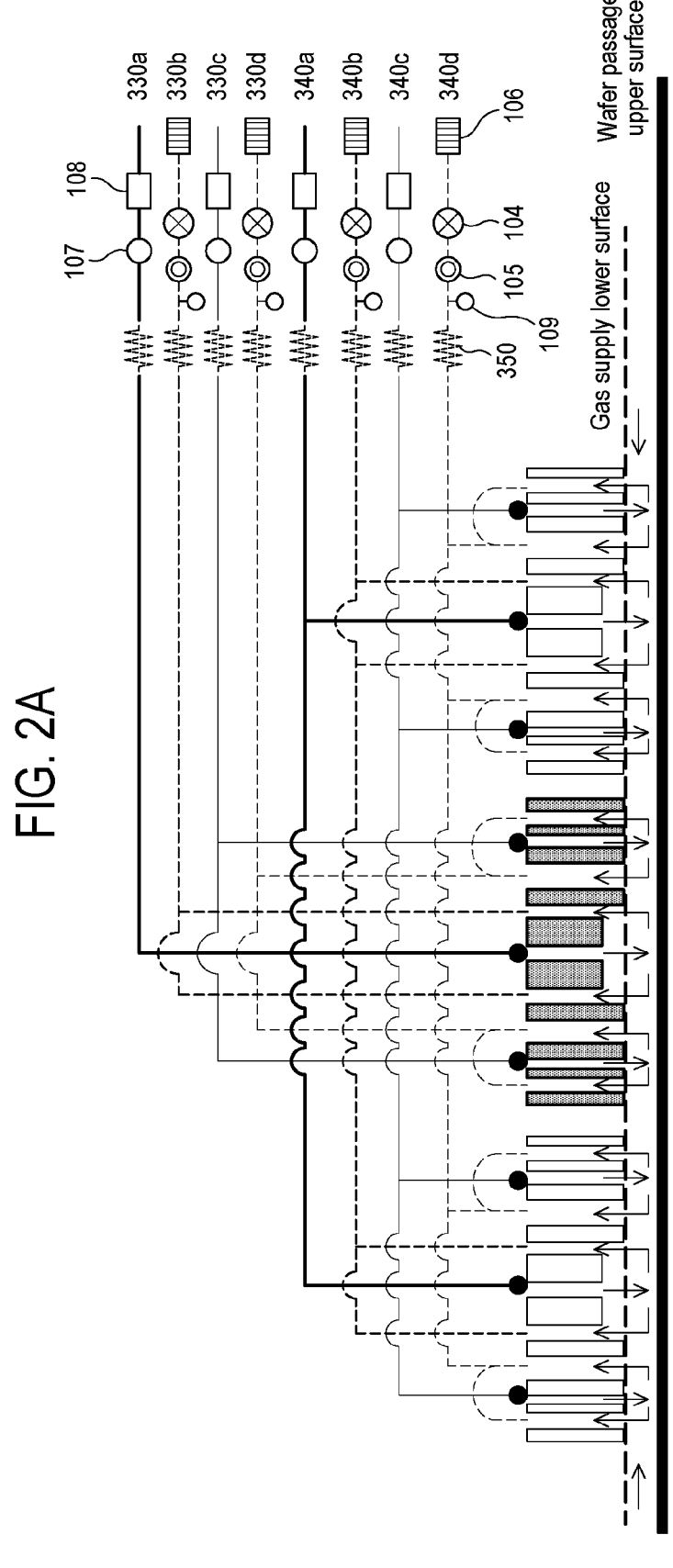
Figure 2B:
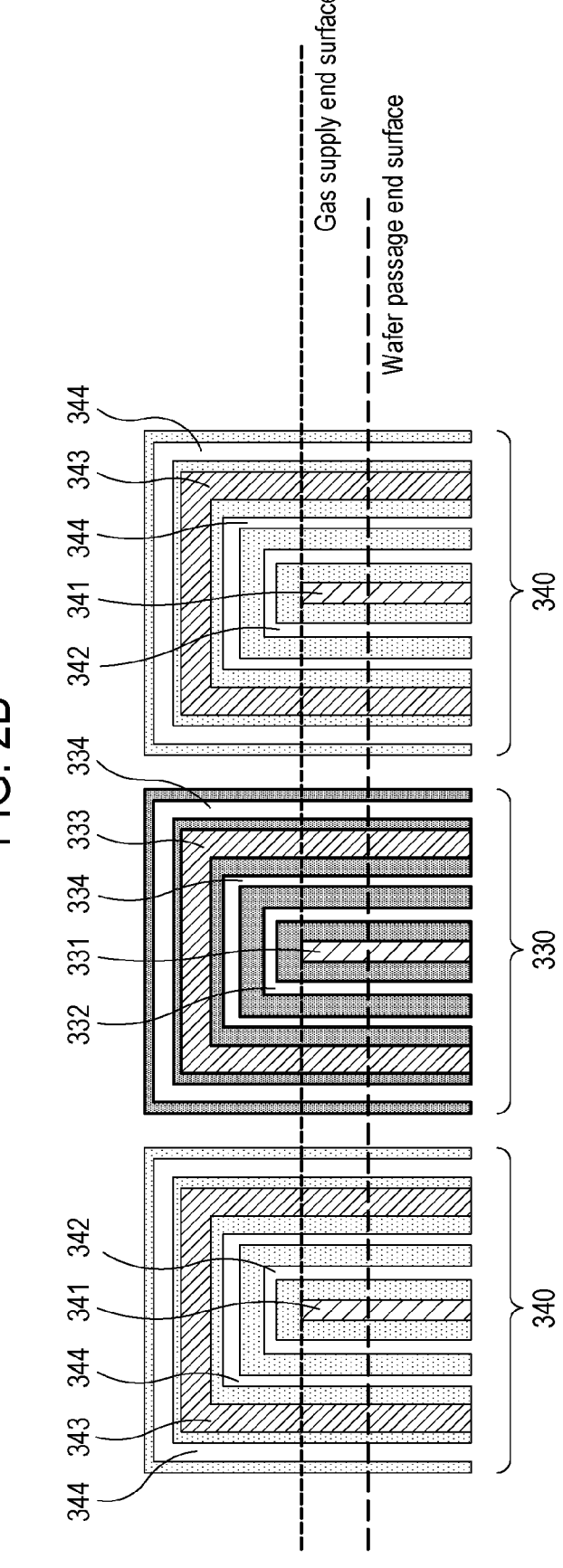

Now, the precursor gas cartridge 330 and the reaction gas cartridge 340 constituting the cartridge head 300 will be described in more detail. FIGS. 2A and 2B are conceptual views showing the cartridge head 300 according to the first embodiment, wherein FIG. 2A is a side sectional view schematically showing an outline of a configuration example of the cartridge head 300, and FIG. 2B is a cross sectional view showing a cross section of a main component of the cartridge head 300.

The precursor gas cartridge 330 includes a precursor gas supplier 331, a precursor gas exhauster 332 installed at an outer periphery of the precursor gas supplier 331, an inert gas supplier 333 installed on an outer periphery of the precursor gas exhauster 332, and inert gas exhausters 334 installed on inner and outer peripheries of the inert gas supplier 333. A gas supply line 330a configured to supply a precursor gas is connected to the precursor gas supplier 331. An exhaust line 330b configured to exhaust the precursor gas is connected to the precursor gas exhauster 332. A gas supply line 330c configured to supply a purge gas is connected to the inert gas supplier 333. An exhaust line 330d configured to exhaust the purge gas is connected to the inert gas exhauster 334. The exhaust lines 330b and 330d may be shared, that is, may have a shared configuration.

The reaction gas cartridge 340 includes a reaction gas supplier 341, a reaction gas exhauster 342 installed on an outer periphery of the reaction gas supplier 341, an inert gas supplier 343 installed on an outer periphery of the reaction gas exhauster 342, and inert gas exhausters 344 installed on inner and outer peripheries of the inert gas supplier 343. A gas supply line 340a configured to supply a reaction gas is connected to the reaction gas supplier 341. An exhaust line 340*b* configured to exhaust the reaction gas is connected to the reaction gas exhauster 342. A gas supply line 340*c* configured to supply a purge gas is connected to the inert gas supplier 343. An exhaust line 340*d* configured to exhaust the purge gas is connected to the inert gas exhauster 344. The exhaust lines 340*b* and 340*d* may be shared, that is, may have a shared configuration.

A flexible tube 350 corresponding to a movement range of the slide mechanism 320 is connected to each of the gas supply lines 330*a*, 330*c*, 340*a* and 340*c* and the exhaust lines 330*b*, 330*d*, 340*b* and 340*d*.

Each of the gas cartridges (the precursor gas cartridge 330 and the reaction gas cartridge 340) is configured to be capable of regulating a pressure inside each of the gas cartridges to be a predetermined pressure by using the first exhauster and the first gas supply pressure described above and is configured to more effectively separate a space to which the precursor gas is supplied and a space to which the reaction gas is supplied (hereinafter, also simply referred to as space separation).

That is, in the precursor gas cartridge 330, the precursor gas is supplied from the precursor gas supplier 331, and the precursor gas is exhausted from the precursor gas exhauster 332, such that a pressure in the space is regulated to be a predetermined pressure. Further, the inert gas is supplied from the inert gas supplier 333, and the inert gas is exhausted from the inert gas exhauster 334, such that the space to which the precursor gas is supplied and an outer side thereof are spatially separated from each other by a gas shield formed by the inert gas.

Further, in the reaction gas cartridge 340, the reaction gas is supplied from the reaction gas supplier 341, and the reaction gas is exhausted from the reaction gas exhauster 342, such that the pressure in the space is regulated to a predetermined pressure. Further, the inert gas is supplied from the inert gas supplier 343, and the inert gas is exhausted from the inert gas exhauster 344, such that the space to which the reaction gas is supplied and an outer side thereof are spatially separated from each other by a gas shield formed by the inert gas.

The cartridge head 300 including the precursor gas cartridge 330 and the reaction gas cartridge 340 is configured to be capable of exposing the entire in-plane region of the wafer 200 uniformly to each gas when the cartridge head 300 moves relative to the wafer 200. Specifically, the cartridge head 300 is configured such that a formation width in a direction orthogonal to the movement direction is larger than an outer width, that is, a diameter of the wafer 200 and thus, a region beyond an outer peripheral edge of the wafer 200 is exposed to each gas, such that the entire in-plane region of the wafer 200 is uniformly exposed to each gas.

Further, in the illustrated example, a total number of installations of the precursor gas cartridge 330 and the reaction gas cartridge 340 is set such that two reaction gas cartridges 340 are arranged on both sides of one precursor gas cartridge 330, but the present disclosure is not limited thereto. The total number of installations may be appropriately set in consideration of the number of types of gases to be supplied to the wafer 200, a processing throughput, and the like. For example, in the case of supplying the precursor gas and the reaction gas, the total number of installations may increase to improve a film-forming throughput in total. However, even when a plurality of cartridges are arranged, the reaction gas cartridges 340 are arranged at both end portions. This is because the film-forming process is completed by exposing the wafer 200 to the reaction gas finally supplied from the reaction gas cartridge 340.

Further, the cartridge head 300 may include cartridges other than the precursor gas cartridge 330 and the reaction gas cartridge 340. Examples of other cartridges include a cartridge that assists energy applied to a reaction system such as a plasma, a lamp or the like, a cartridge that assists oxidation or nitriding, a cartridge that assists gas replacement, and combinations thereof.

Slide Mechanism

As shown in FIGS. 1A to 1C, a slide mechanism 220 as a first actuator configured to allow the substrate mounting stand 210 to reciprocate in the process container 101 is connected to the lower end portion of the substrate mounting stand 210. The slide mechanism 220 is fixed to the bottom of the process container 101. The slide mechanism 220 is configured to allow the wafer 200 on the substrate mounting stand 210, that is, on the substrate mounting surface to reciprocate in the horizontal direction between the first area and the second area. The slide mechanism 220 may include, for example, a combination of a guide rail, a feed screw (ball screw), a drive source typified by an electric motor M, and the like.

A slide mechanism 320 as a second actuator configured to allow the cartridge head mounting stand 310 to reciprocate in the process container 101 is connected to the lower end portion of the cartridge head mounting stand 310. The slide mechanism 320 is fixed to the bottom of the process container 101. The slide mechanism 320 is configured to allow the cartridge head mounting stand 310, that is, the cartridge head 300 (the precursor gas cartridge 330 and the reaction gas cartridge 340) supported on the upper end portion of the cartridge head mounting stand 310 to reciprocate in the horizontal direction between the second area and the first area. The slide mechanism 320 may include, for example, a combination of a guide rail, a feed screw (ball screw), a drive source typified by an electric motor M, and the like.

That is, inside the process container 101, the wafer 200 supported by the substrate mounting stand 210 reciprocates by allowing the substrate mounting stand 210 to reciprocate by the slide mechanism 220. Further, by allowing the cartridge head mounting stand 310 to reciprocate by the slide mechanism 320, the cartridge head 300 supported by the cartridge head mounting stand 310 reciprocates.

Further, when the inside of the process container 101 is viewed in a plane view or a front view, the width of the cartridge head mounting stand 310 is larger than a width of the substrate mounting stand 210 as shown in FIGS. 1A and 1C. The cartridge head mounting stand 310 is configured to slide outside the substrate mounting stand 210, and the substrate mounting stand 210 is configured to slide inside the cartridge head mounting stand 310. The substrate mounting stand 210 is configured to slide outside the heater 230, and the heater 230 is fixed to the inside of the substrate mounting stand 210 that makes a sliding movement.

With such a configuration, the substrate mounting stand 210 and the cartridge head mounting stand 310 may make linear reciprocating movement in the horizontal direction without interfering with each other and independently of each other.

The substrate mounting stand 210 and the cartridge head mounting stand 310 are configured to reciprocate in opposite directions to each other. That is, while the slide mechanism 220 allows the substrate mounting stand 210 to reciprocate, the slide mechanism 320 is configured to allow the cartridge head 300 supported on the cartridge head mounting stand 310 to reciprocate in a direction opposite to that of the substrate mounting stand 210, that is, in a direction opposite to the movement direction of the substrate mounting stand 210.

For example, when the substrate mounting stand 210 (wafer 200) is located in the first area, the slide mechanisms 220 and 320 position the cartridge head 300 in the second area. When the slide mechanisms 220 and 320 start to move in this state, the substrate mounting stand 210 is moved from the first area to the second area, and the cartridge head 300 is moved from the second area to the first area. Further, for example, when the cartridge head 300 is located in the first area, the slide mechanisms 220 and 320 position the substrate mounting stand 210 (wafer 200) in the second area. When the slide mechanisms 220 and 320 start to move in this state, the cartridge head 300 is moved from the first area to the second area, and the substrate mounting stand 210 is moved from the second area to the first area.

The slide mechanisms 220 and 320 perform the above-mentioned reciprocating movement by operating a drive source such as an electric motor M or the like in each of the slide mechanisms 220 and 320. Therefore, the relative positional relationship between the wafer 200 mounted on the upper surface of the substrate mounting stand 210 and the cartridge head 300 may be regulated by controlling the drive sources of the slide mechanisms 220 and 320 respectively.

The substrate mounting stand 210 and the cartridge head mounting stand 310 reciprocating in opposite directions to each other may be made of the same material or materials with approximate thermal expansion coefficients to minimize change in an influence of heat from the heater 230 on each of the cartridge head 300 and the wafer 200 due to a gap therebetween. Further, installation heights of the guide rails of the slide mechanisms 220 and 320 configured to respectively move the substrate mounting stand 210 and the cartridge head mounting stand 310 may also be configured to be at approximate heights in the process container 101. Further, at a position higher than the guide rails of the slide mechanisms 220 and 320 below the substrate mounting surface of the substrate mounting stand 210, or below the heater 230, a local purge/exhaust mechanism 160 configured to perform local gas purging and local exhaust may be installed to minimize influence of the gas leaked from the gas cartridge 300 on each of the slide mechanisms 220 and 320.

Controller

As shown in FIGS. 1A to 1C, the substrate processing apparatus 100 includes a controller 110 as a controller that controls an operation of each component of the substrate processing apparatus 100. The controller 110 is configured as a computer including at least hardware resources such as a calculator 120 and a memory 130. The controller 110 is connected to each of the above-described components and is configured to read a control program and a process recipe (hereinafter simply collectively referred to as "program"), which is predetermined software, from the memory 130 in response to an instruction from a host controller, an operator or the like and control the operation of each component according to contents of the read program. That is, the controller 110 is configured such that the hardware resources execute the program which is the predetermined software, whereby the hardware resources and the predetermined software cooperate to control the operation of each component of the substrate processing apparatus 100. In addition, when the term "program" is used herein, it may include a control program, a process recipe alone, or both.

The controller 110 as described above may be configured as a dedicated computer or a general-purpose computer. For example, the controller 110 according to the present embodiment may be configured by providing an external memory 140 in which the above-mentioned program is stored and installing the program in a general-purpose computer by using the external memory 140. The external memory 140 includes, for example, a magnetic tape, a magnetic disk such as a flexible disk or a hard disk, an optical disk such as a CD or a DVD, a magneto-optical disk such as an MO or the like, a semiconductor memory such as a USB memory or a memory card, and the like. Further, a method of supplying the program to the computer is not limited to the case of supplying the program via the external memory 140. For example, a communication means or unit such as the Internet or a dedicated line may be used, or information may be received from a host apparatus via a receiver and the program may be supplied without going through the external memory 140.

The memory 130 in the controller 110 and the external memory 140 connectable to the controller 110 are configured as a computer-readable recording medium. Hereinafter, these are collectively and simply referred to as a recording medium. When the term "recording medium" is used herein, it may include the memory 130, which is a memory, the external memory 140, or both.

(2) Outline of Substrate Processing Process

Next, as a process of manufacturing a semiconductor device, a process of forming a thin film on the wafer 200 by using the substrate processing apparatus 100 will be described. In the following description, an operation of each component constituting the substrate processing apparatus 100 is controlled by the controller 110.

Now, description will be made on an example where a titanium nitride film (TiN film), which is a metal nitride film, is formed on the wafer 200 as a conductive metal thin film by using a tetrachlorotitanium ($TiCl_4$) gas as a precursor gas, using an ammonia ($NH_3$) gas as a reaction gas, and exposing the surface of the wafer 200 to these gases alternatively by a relative movement between the cartridge head 300 and the substrate mounting stand 210.

Figure 3:
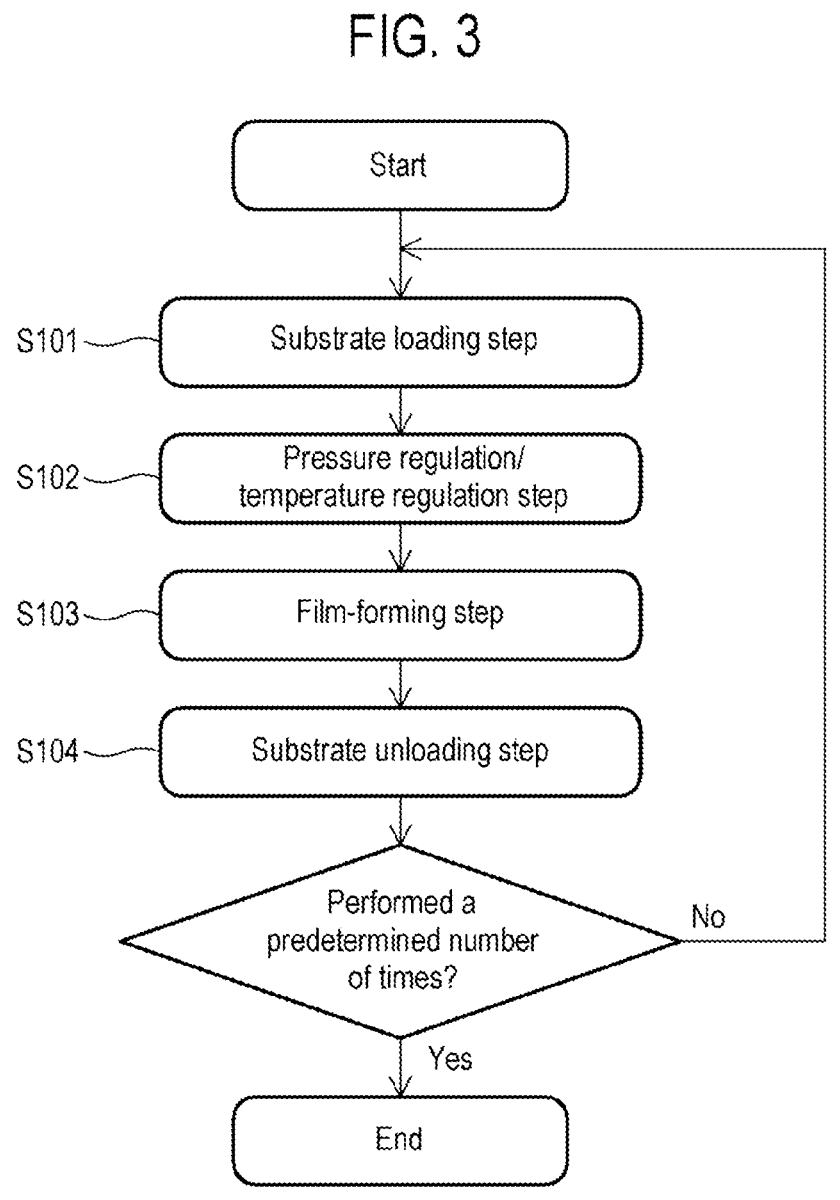

FIG. 3 is a flowchart showing a procedure of the substrate processing process according to the first embodiment of the present disclosure.

Substrate Loading Step: S101

In the substrate processing process, first, the wafer 200 is loaded into the process container 101. Specifically, the gate valve 103 installed at a substrate loading/unloading port 102 installed on the side surface of the process container 101 of the substrate processing apparatus 100 is opened, and the wafer 200 is loaded into the process container 101 by using a wafer transfer machine (not shown). Thereafter, the wafer 200 loaded into the process container 101 is mounted on the substrate mounting surface of the substrate mounting stand 210 by using a wafer elevating mechanism 150 including lift pins or the like. Then, the wafer transfer machine is retracted to the outside of the process container 101, and the gate valve 103 is closed to close the substrate loading/unloading port 102, thereby sealing the inside of the process container 101.

Pressure Regulation/Temperature Regulation Step:
S102

After the wafer 200 is loaded into the process container 101 and mounted on the substrate mounting surface of the substrate mounting stand 210, the pressure and temperature inside the process container 101 are regulated. Specifically, the exhaust valve 104a installed at the exhaust line 500d directly connected to the process container 101 is opened, and the vacuum pump 106a connected to the exhaust line 500d is used to vacuum-evacuate the inside of the process container 101. At the same time, the valve 107a installed at the gas supply line 500c directly connected to the process container 101 is opened, and a $N_2$ gas is supplied into the process container 101 at a flow rate controlled by the MFC 108a to a desired flow rate, for example, a predetermined flow rate within a range of 0.1 to 20 slm. Then, the pressure in the process container 101 is controlled by using the pressure controller 105a to a desired processing pressure, for example, a predetermined pressure within a range of 10 to 5000 Pa. At this time, the pressure in the process container 101 is measured by the pressure sensor 109a, and the pressure controller 105a is feedback-controlled based on the measured pressure information. Further, the heater 230 is controlled such that the wafer 200 has a desired processing temperature, for example, a predetermined temperature within a range of 300 to 600 degrees C. At this time, a state of supplying electric power to the heater 230 is feedback-controlled based on the temperature information detected by the temperature sensor 230a installed in the vicinity of the wafer 200. Both operation of the vacuum pump 106 and the heating of the wafer 200 are continuously performed at least until the processing of the wafer 200 is completed.

Film-Forming Step: S103

After the inside of the process container 101 has a desired processing pressure and the wafer 200 has a desired processing temperature, a film-forming step (S103) is performed. When roughly classified, the film-forming step (S103) includes a relative position movement processing operation and a gas supply/exhaust processing operation.

Relative Position Movement Processing Operation

The relative position movement processing operation is a processing operation of moving a relative position between the wafer 200 and the cartridge head 300. Specifically, the slide mechanism 220 allows the substrate mounting stand 210 to reciprocate, and the slide mechanism 320 allows the cartridge head mounting stand 310 to reciprocate, thereby moving the relative position between the wafer 200 mounted on the upper surface of the substrate mounting stand 210 and the cartridge head 300 supported by the cartridge head mounting stand 310. At this time, the substrate mounting stand 210 and the cartridge head mounting stand 310 reciprocate to move in opposite directions to each other.

Due to such a relative position movement processing operation, while at least a portion of the wafer 200 and at least a portion of the cartridge head 300 that has supplied the gas overlap each other in a plane view, a surface of the wafer 200 is exposed to the gas supplied from the cartridge head 300. Thus, the gas supply/exhaust processing operation described later is performed on the surface of the wafer 200. As a result, a substantial film-forming process is executed on the surface of the wafer 200.

Specific processing operations when moving the relative position between the wafer 200 and the cartridge head 300 will be described in detail later.

Gas Supply/Exhaust Processing Operation

Next, the gas supply/exhaust processing operation in the film-forming step (S103) will be described.

The gas supply/exhaust processing operation is a processing operation of performing first to fourth gas supply/exhaust operations described below.

First, while opening the exhaust valve 104a installed at the exhaust line 500d directly connected to the process container 101 and vacuum-evacuating the inside of the process container 101 by using the vacuum pump 106a connected to the exhaust line 500d, the valve 107a installed at the gas supply line 500c directly connected to the process container 101 is opened to supply a $N_2$ gas, at a flow rate which is controlled by the MFC 108a to a desired flow rate, for example, a predetermined flow rate within a range of 0.1 to 20 slm, into the process container 101. At this time, the pressure in the process container 101 is controlled by the pressure controller 105a to a desired processing pressure, for example, a predetermined pressure within a range of 10 to 5000 Pa.

Secondly, while opening the exhaust valves 104 installed at the exhaust lines 330d and 340d connected to the precursor gas cartridge 330 and the reaction gas cartridge 340, respectively, and vacuum-evacuating the insides of the exhaust lines 330d and 340d by using the vacuum pump 106 respectively, the valves 107 installed at the gas supply lines 330c and 340c connected to the precursor gas cartridge 330 and the reaction gas cartridge 340 respectively are opened to supply the $N_2$ gases as the purge gas, at flow rates which are controlled by respective MFCs 108 to desired flow rates, for example, a predetermined flow rate within a range of 0.1 to 20 slm, into the process container 101. At this time, the pressures in the exhaust lines 330d and 340d are controlled to predetermined pressures in the range of, for example, 10 to 100 Pa by using the pressure controllers 105 installed at the exhaust lines 330d and 340d, respectively. This makes it possible to form the gas shield to perform the above-mentioned space separation.

Thirdly, while opening the exhaust valve 104 installed at the exhaust line 340b connected to the reaction gas cartridge 340 and vacuum-evacuating the inside of the exhaust line 340b by using the vacuum pump 106, the valve 107 installed at the gas supply line 340a connected to the reaction gas cartridge 340 is opened to supply a $NH_3$ gas as a reaction gas, at a flow rate which is controlled by the MFC 108 to a desired flow rate, for example, a predetermined flow rate within a range of 0.1 to 20 slm. At this time, the pressure in the exhaust line 340b is controlled to, for example, a pressure higher than the pressure in the exhaust lines 330d and 340d by the pressure controller 105. At this time, as the pressure in the exhaust line 340b increases, the reaction effect may be expected to be higher. However, care is to be taken not to impair the gas shield by the purge gas.

Fourthly, while opening the exhaust valve 104 installed at the exhaust line 330b connected to the precursor gas cartridge 330 and vacuum-evacuating the inside of the exhaust line 330b by using the vacuum pump 106, the valve 107 installed at the gas supply line 330a connected to the precursor gas cartridge 330 is opened to supply a $TiCl_4$ gas as a precursor gas, at a flow rate which is controlled by the MFC 108 to a desired flow rate, for example, a predetermined flow rate within a range of 0.01 to 5 slm, into the process container 101. At this time, the pressure in the exhaust line 330*b* is controlled to, for example, be a pressure equal to or higher than the pressure in the exhaust lines 330*d* and 340*d* by using the pressure controller 105. At this time, as the pressure in the exhaust line 330*b* increases, the reaction effect may be expected to be higher. However, care is to be taken not to impair the gas shield by the purge gas and not to impair a film-forming performance due to influence of an abnormal reaction or by-products of the precursor gas, that is, the $TiCl_4$ gas. However, depending on the type of the precursor gas, the pressure in the exhaust line 330*b* may be set to a lower pressure. In that case, the pressure in the exhaust line 330*b* is controlled to, for example, a pressure lower than the pressure in the exhaust lines 330*d* and 340*d* by using the pressure controller 105.

The above-described gas supply/exhaust processing operation, that is, the processing operation of performing the first to fourth gas supply/exhaust operations, is continuously performed at least until the film-forming process on the wafer 200 is completed. That is, after the gas supply/exhaust processing operation is started, the exhaust valves 104*a* and 104 and the valves 107*a* and 107 are maintained in an open state at least until the film-forming process on the wafer 200 is completed. Thus, during this period, the exhaust valves 104*a* and 104 and the valves 107*a* and 107 may not be opened and closed. As a result, the lifespans of the exhaust valves 104*a* and 104 and the valves 107*a* and 107 may be significantly extended, and the frequency of replacement thereof may be significantly reduced.

By performing the gas supply/exhaust processing operations in combination with the relative position movement processing operation described above, a TiN film is formed on the wafer 200. Assuming that the operation of the cartridge head 300 passing through the upper surface of the wafer 200 in one direction is one cycle, the operation of allowing the wafer 200 and the cartridge head 300 to reciprocate in opposite directions to each other corresponds to two cycles. This cycle is performed a predetermined number of times until a thickness of the TiN film formed on the wafer 200 reaches a predetermined film thickness.

For example, in the case of the cartridge head 300 of the configuration shown in FIGS. 2A and 2B, when the cartridge head 300 passes through the upper surface of the wafer 200 in one direction, an order of the gas supply/exhaust processing operations performed on the wafer 200 is as follows. In the following description, (V) means an exhaust region.

(V) $N_2$ (V)→(V) $NH_3$ (V)→(V) $N_2$ (V)→(V) $N_2$ (V)→ (V) $TiCl_4$ (V)→(V) $N_2$ (V)→(V) $N_2$ (V)→(V) $NH_3$ (V)→ (V) $N_2$ (V)

Focusing on the operation (1 cycle) in which the cartridge head 300 passes through the upper surface of the wafer 200 in one direction, the surface of the wafer 200 is exposed to various gases in the following order.

$N_2$→$NH_3$→$N_2$→$N_2$→$TiCl_4$→$N_2$→$N_2$→$NH_3$→$N_2$

Focusing on the operation (two cycles) of allowing the cartridge head 300 and the wafer 200 to reciprocate one time in opposite directions to each other, the surface of the wafer 200 is exposed to various gases in the following order.

$N_2$→$NH_3$→$N_2$→$N_2$→$TiCl_4$→$N_2$→$N_2$→$NH_3$→$N_2$→ $N_2$→$NH_3$→$N_2$→$N_2$→$TiCl_4$→$N_2$→$N_2$→$NH_3$→$N_2$

Further, focusing on the precursor gas and the reaction gas and on a reciprocating path (two cycles), the surface of the wafer 200 is exposed to various gases in the following order.

$NH_3$→$TiCl_4$→$NH_3$→$NH_3$→$TiCl_4$→$NH_3$

That is, in the case where the cartridge head 300 and the wafer 200 reciprocate in opposite directions to each other, when each of the cartridge head 300 and the wafer 200 reaches one end side or the other end side and turns back in the process container 101, the surface of the wafer 200 is exposed to the $NH_3$ gas as the reaction gas twice in succession and is subjected to a nitriding process twice in succession.

Reaction Mechanism

When the cartridge head 300 and the wafer 200 reciprocate in opposite directions to each other (hereinafter also referred to as cross-swing), a portion of the surface of the wafer 200 that faces the cartridge head 300 in the vertical direction, that is, a portion (hereinafter referred to as an OL portion) of the surface of the wafer 200 that overlaps with the cartridge head 300 in a plane view is first exposed to the $NH_3$ gas. At this time, the OL portion of the surface of the wafer 200 is nitrided by the $NH_3$ gas and the outermost surface thereof is NH-terminated.

Next, the NH-terminated OL portion of the surface of the wafer 200 is exposed to the $N_2$ gas, and the $NH_3$ gas remaining on the OL portion is purged.

Next, the NH-terminated OL portion of the surface of the wafer 200 is exposed to the $TiCl_4$ gas, and a Ti-containing layer containing Cl is formed on the NH-terminated OL portion. The Ti-containing layer containing Cl is formed by physical adsorption or chemical adsorption of $TiCl_4$ to the OL portion, chemical adsorption of a substance ($TiCl_x$) generated by decomposition of a portion of $TiCl_4$, deposition of Ti by thermal decomposition of $TiCl_4$, and the like. The Ti-containing layer containing Cl may be an adsorption layer (physical adsorption layer or chemical adsorption layer) of $TiCl_4$ or $TiCl_x$, or may be a deposition layer of Ti containing Cl. The Ti-containing layer containing Cl described herein is also simply referred to as a Ti-containing layer. When the Ti-containing layer is formed, a portion of Cl contained in the $TiCl_4$ gas forms a gaseous substance containing Cl and undergoes desorption in the process of forming the Ti-containing layer.

As the precursor gas, in addition to the $TiCl_4$ gas, it may be possible to use a tetrakisdimethylaminotitanium ($Ti[N(CH_3)_2]_4$, abbreviation: TDMAT) gas, a tetrakisdiethylaminotitanium ($Ti[N(C_2H_5)_2]_4$, abbreviation: TDEAT) gas, or the like.

Next, the OL portion of the surface of the wafer 200 on which the Ti-containing layer is formed is exposed to the $N_2$ gas, and the $TiCl_4$ gas remaining on the OL portion, reaction by-products, and the like are purged.

Next, the OL portion of the surface of the wafer 200 on which the Ti-containing layer is formed is exposed to the $NH_3$ gas, and at least a portion of the Ti-containing layer formed on the OL portion is nitrided. By nitriding the Ti-containing layer, a layer containing Ti and N, that is, a titanium nitride layer (TiN layer) is formed on the OL portion. When forming the TiN layer, impurities such as Cl contained in the Ti-containing layer form a gaseous substance containing Cl and undergo desorption in the process of the nitriding reaction of the Ti-containing layer with the $NH_3$ gas. As a result, the TiN layer becomes a layer having less impurities such as Cl or the like as compared with the Ti-containing layer before nitriding.

As the reaction gas, in addition to the $NH_3$ gas, it may be possible to use, for example, a hydronitrogen-based gas such as a diazene ($N_2H_2$) gas, a hydrazine ($N_2H_4$) gas, a $N_3H_8$ gas or the like.

Next, the OL portion of the surface of the wafer 200 on which the TiN layer is formed is exposed to the $N_2$ gas, and the $NH_3$ gas remaining on the OL portion, reaction by-products, and the like are purged.

These constitute an outward path of the cross swing, that is, a reaction generated in one cycle. By performing this cycle a predetermined number of times (n times where n is an integer of 1 or more), a TiN film of a predetermined composition and a predetermined film thickness is formed on the wafer 200. The above-described cycle may be performed a plurality of times. That is, the thickness of the TiN layer formed per cycle may be set to be smaller than a desired film thickness, and the above-described cycle may be performed a plurality of times until the film thickness of the TiN film formed by stacking the TiN layers becomes the desired film thickness.

Processing conditions in the film-forming step (S103) are exemplified as follows.

Processing temperature: 300 to 600 degrees C., specifically 450 to 550 degrees C.

Processing pressure: 10 to 5000 Pa, specifically 50 to 1000 Pa $TiCl_4$ gas supply flow rate: 0.01 to 5 slm, specifically 0.1 to 1 slm $NH_3$ gas supply flow rate (each line): 0.1 to 20 slm, specifically 0.1 to 1 slm $N_2$ gas supply flow rate (each line): 0.1 to 20 slm, specifically 1 to 10 slm Time per cycle (one-sided passage): 2 to 10 seconds

After-Purge and Inert Gas Replacement

After the TiN film of a predetermined composition and a predetermined film thickness is formed on the wafer 200, the $N_2$ gas is supplied as a purge gas from each of the gas supply lines 330c, 340c and 500c into the process container 101 and is exhausted from the exhaust lines 330d, 340d and 500d. As a result, the inside of the process container 101 is purged, and the gas, reaction by-products, and the like remaining in the process container 101 are removed from the inside of the process container 101 (after-purge). Thereafter, the atmosphere in the process container 101 is replaced with the inert gas (inert gas replacement), and the pressure in the process container 101 is changed to a predetermined transfer pressure or returned to the atmospheric pressure (atmospheric pressure restoration).

Substrate Unloading Step: S104

Thereafter, a substrate unloading step (S104) is performed. In the substrate unloading step (S104), the processed wafer 200 is unloaded from the process container 101 by the wafer transfer machine in the reverse procedure of the substrate loading step (S101).

A series of processes from the substrate loading step (S101) to the substrate unloading step (S104) described above are performed on each of the processing target wafers 200. That is, the above-described series of processes (S101 to S104) are performed a predetermined number of times by changing the wafer 200. When the processing of the processing target wafers 200 is completed, the substrate processing process comes to an end.

(3) Specific Processing Operation of Relative Position Movement

Next, a specific processing operation of moving the relative position in the film-forming step (S103) described above, that is, a specific processing operation when moving the relative position between the wafer 200 and the cartridge head 300 will be described in more detail.

Procedure of Relative Position Movement

Figure 4:
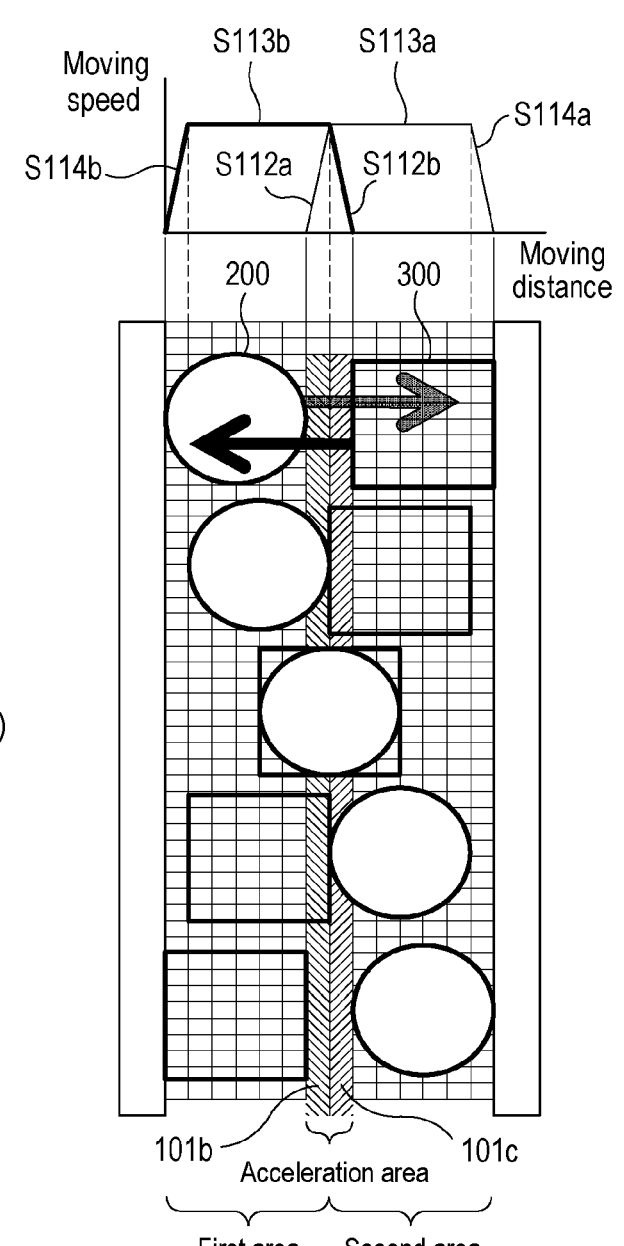
FIG. 4 is a chart diagram showing an outline of a relative position movement processing operation performed in a film-forming process according to the first embodiment of the present disclosure.

FIG. 4 is a chart diagram showing an outline of the relative position movement processing operation performed in the film-forming process according to the first embodiment of the present disclosure.

Now, it is considered, for example, a state in which as shown in FIG. 4, the substrate mounting stand 210 that supports the wafer 200 is located in the first area on one end side in the process container 101, and the cartridge head mounting stand 310 that supports the cartridge head 300 is located in the second area on the other end side in the process container 101. Hereinafter, the positions of the wafer 200 and the cartridge head 300 in this state are referred to as home position (A) (S111).

When starting the relative position movement of the wafer 200 and the cartridge head 300 from the home position (A), the slide mechanism 220 moves the substrate mounting stand 210 toward the second area and increases a moving speed of the substrate mounting stand 210 to reach a desired speed until it passes through an acceleration/deceleration area 101b (S112 and S112a). Concurrently, the slide mechanism 320 moves the cartridge head mounting stand 310 toward the first area and increases a moving speed of the cartridge head mounting stand 310 to reach a desired speed until it passes through an acceleration/deceleration area 101c (S112 and S112b).

Then, when the moving speed of the substrate mounting stand 210 reaches the desired speed, the slide mechanism 220 moves the substrate mounting stand 210 toward the second area at the desired speed (S113 and S113a). On the other hand, when the moving speed of the cartridge head mounting stand 310 reaches the desired speed, the slide mechanism 320 moves the cartridge head mounting stand 310 toward the first area at the desired speed (S113 and S113b). As a result, the wafer 200 supported by the substrate mounting stand 210 and the cartridge head 300 supported by the cartridge head mounting stand 310 are moved in opposite directions to each other in a state where the wafer 200 and the cartridge head 300 overlap each other at least partially in a plane view. At this time, the surface of the wafer 200 is exposed to the gas supplied from the cartridge head 300, whereby the film-forming process on the surface of the wafer 200 is executed.

Thereafter, when the overlap between the wafer 200 and the cartridge head 300 in the plane view is eliminated, the slide mechanism 220 reduces the moving speed of the substrate mounting stand 210 until the substrate mounting stand 210 stops, while using the acceleration/deceleration area 101c (S114 and S114a). Concurrently, the slide mechanism 320 reduces the moving speed of the cartridge head mounting stand 310 until the cartridge head mounting stand 310 stops, while using the acceleration/deceleration area 101b (S114 and S114b).

When the substrate mounting stand 210 and the cartridge head mounting stand 310 stop, the substrate mounting stand 210 that supports the wafer 200 is located in the second area on the other end side in the process container 101, and the cartridge head mounting stand 310 that supports the cartridge head 300 is located in the first area on one end side in the process container 101. Hereinafter, the positions of the wafer 200 and the cartridge head 300 in this state are referred to as home position (B) (S115).

After the wafer 200 and the cartridge head 300 are positioned in the home position (B), the slide mechanism 220 moves the substrate mounting stand 210, and the slide mechanism 320 moves the cartridge head mounting stand 310 in the opposite direction to the above-described direction such that the wafer 200 and the cartridge head 300 are located in the home position (A) again.

As described above, when the relative position of the wafer 200 and the cartridge head 300 is moved, the slide mechanism 220 allows the substrate mounting stand 210 to reciprocate between the first area and the second area, and the slide mechanism 320 allows the cartridge head mounting stand 310 to reciprocate between the second area and the first area. That is, the wafer 200 and the cartridge head 300 reciprocate in opposite directions to each other. As a result, in the process container 101, the state in which the wafer 200 and the cartridge head 300 are located at the home position (A) and the state in which the wafer 200 and the cartridge head 300 are located at the home position (B) are transitioned sequentially.

When the relative position movement processing operation as described above is performed, the wafer 200 and the cartridge head 300 reciprocate in opposite directions to each other. Therefore, as compared with a case where the wafer 200 or the cartridge head 300 is moved linearly, it is possible to reduce the movement range of the wafer 200 and the cartridge head 300 (hereinafter also simply referred to as movement range) when performing the relative position movement.

Figures 5A, 5B, 5C:
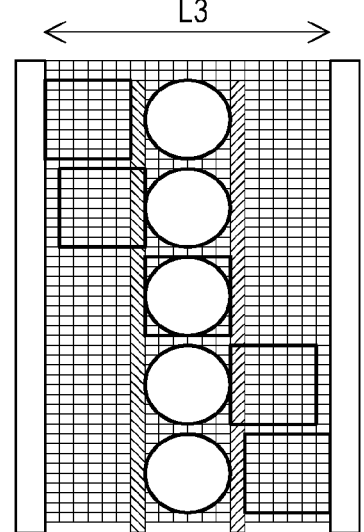

Hereinafter, the movement range of the relative position movement processing operation will be described with reference to specific examples. FIGS. 5A to 5C are explanatory views that compares the movement ranges of the relative position movement processing operation, wherein FIG. 5A is a view showing a movement range according to the first embodiment of the present disclosure, FIG. 5B is a view showing a movement range in Comparative Example 1, and FIG. 5C is a view showing a movement range in Comparative Example 2.

According to the relative position movement processing operation of the first embodiment of the present disclosure, as shown in FIG. 5A, a sum of at least a diameter of the wafer 200, a moving-direction width of the cartridge head 300 and widths of the acceleration/deceleration areas 101b and 101c may be secured as a distance L1 between one end side and the other end side in the process container 101. That is, the movement range L1 of the relative position movement processing operation in this case may include at least sizes of the wafer 200 and the cartridge head 300 in addition to sizes of the acceleration/deceleration areas 101b and 101c.

On the other hand, in the case of Comparative Example 1 in which the wafer is moved linearly while the cartridge head is fixed during the relative position movement, as shown in FIG. 5B, a movement range L2 may be set to include, in addition to the acceleration/deceleration areas, a sum of an area twice the diameter of the wafer and the moving-direction width of the cartridge head. That is, since a wafer retraction space may be secured in the process container before and after the linear movement, the sum may include the area twice the diameter of the wafer.

Further, in the case of Comparative Example 2 in which the cartridge head is moved linearly while the wafer is fixed during the relative position movement, as shown in FIG. 5C, a movement range L3 may be set to include, in addition to the acceleration/deceleration areas, a sum of the diameter of the wafer and an area twice the moving-direction width of the cartridge head. That is, since a cartridge head retraction space may be secured in the process container before and after the linear movement, the sum may include the area twice the moving-direction width of the cartridge head.

As described above, according to the relative position movement processing operation of the first embodiment of the present disclosure, the wafer 200 and the cartridge head 300 reciprocate in opposite directions to each other. Therefore, the movement range L1 when performing the relative position movement may be made smaller than the movement range L2 in the case of Comparative Example 1 or the movement range L3 in the case of Comparative Example 2.

This means that in the first embodiment, the distance L1 between one end side and the other end side in the process container 101 is less than the sum of the area twice the diameter of the wafer 200 and the moving-direction width of the cartridge head 300 or less than the sum of twice the moving-direction width of the cartridge head 300 and the diameter of the wafer 200. That is, the process container 101 is configured so that the distance L1 between one end side and the other end side of the wafer 200 and the cartridge head 300 in the moving direction thereof is less than the sum of the area twice the diameter of the wafer 200 and the moving-direction width of the cartridge head 300 or less than the sum of the area twice the moving-direction width of the cartridge head 300 and the diameter of the wafer 200.

Therefore, in the substrate processing apparatus 100 of the first embodiment of the present disclosure, the movement range L1 when the wafer 200 and the cartridge head 300 moves relative to each other may be reduced. This makes it possible to reduce a volume of the process container 101 and accordingly reduce the footprint (occupation area) of the substrate processing apparatus 100.

In the present embodiment, there has been described the case where during the relative position movement processing operation, the wafer 200 and the cartridge head 300 are moved between the home position (A) and the home position (B), but the present disclosure is not limited thereto. For example, turning-back (reversal) of the moving direction of the wafer 200 and the cartridge head 300 may be performed before the wafer 200 and the cartridge head 300 reach the home position (A) or the home position (B), that is, in a state where the wafer 200 and the cartridge head 300 at least partially overlap each other in the plane view. That is, the moving directions of the wafer 200 and the cartridge head 300 may be reversed in a state where the wafer 200 and the cartridge head 300 are not completely separated from each other in the plane view. In that case, the slide mechanisms 220 and 320 are configured to allow the substrate mounting stand 210 supporting the wafer 200 and the cartridge head mounting stand 310 supporting the cartridge head 300 to reciprocate, while maintaining a state where the wafer 200 supported by the substrate mounting stand 210 and the cartridge head 300 supported by the cartridge head mounting stand 310 at least partially overlap each other in the plane view.

Even in a case where the wafer 200 and the cartridge head 300 reciprocate in this way while maintaining the overlap of the wafer 200 and the cartridge head 300 in the plane view, for example, when the cartridge head 300 is formed by arranging the reaction gas cartridges 340 on both sides of the precursor gas cartridge 330, it is possible to prevent turning-back (reversal) of the moving direction of each of the wafer 200 and the cartridge head 300, while maintaining the overlap thereof, from adversely affecting the film-forming process. On the other hand, when the wafer 200 and the cartridge head 300 reciprocate while maintaining the overlap thereof in the plane view, it is possible to reduce (shorten)

the movement range (stroke) during the relative position movement, as compared with the case where the wafer 200 and the cartridge head 300 reach the home position (A) or the home position (B). Accordingly, it is possible to further reduce the volume of the process container 101 and further reduce the footprint of the substrate processing apparatus 100. In addition, the film-forming process may be expedited accordingly.

Speed Control Mode

Next, the mode of speed control of the wafer 200 and the cartridge head 300 (hereinafter also simply referred to as speed control) when moving the relative position between the wafer 200 and the cartridge head 300 will be specifically described. The mode of speed control described below is controlled by the controller 110.

As described above, in the relative position movement processing operation, there are a period in which the wafer 200 and the cartridge head 300 do not overlap each other in a plane view (S111, S112, S114 and S115 in FIG. 4), and a period in which the wafer 200 and the cartridge head 300 at least partially overlap each other in a plane view (S113 in FIG. 4). Hereinafter, the period in which the wafer 200 and the cartridge head 300 do not overlap each other is referred to as a "first period," and the period in which the wafer 200 and the cartridge head 300 at least partially overlap is referred to as a "second period." The second period corresponds to a substantial film-forming process period.

In the first period and the second period, different modes of speed control are performed. That is, the slide mechanisms 220 and 320 perform different modes of speed control in the first period and the second period on the substrate mounting stand 210 supporting the wafer 200 and the cartridge head mounting stand 310 supporting the cartridge head 300. Specifically, for example, in the first period, the speed control is performed to accelerate or decelerate the moving speeds of the wafer 200 and the cartridge head 300. In the second period, the speed control is performed such that the relative moving speed between the wafer 200 and the cartridge head 300 is constant.

When the different modes of speed control are performed in the first period and the second period as described above, it is possible to efficiently accelerate or decelerate the wafer 200 and the cartridge head 300 during the first period, while moving the wafer 200 and the cartridge head 300 at a suitable speed in the film-forming process during the second period. Therefore, even when the wafer 200 and the cartridge head 300 reciprocate in opposite directions to each other, the reciprocating movement may be performed smoothly and efficiently. Moreover, fluctuation in speed during the first period does not affect the moving speed in the second period, which may optimize the film-forming process.

The mode of speed control between the first period and the second period may be changed to perform different modes of speed control in the first period and the second period. Timings of the change in the mode of speed control may be synchronized with respect to each of the movement of the wafer 200 and the movement of the cartridge head 300. That is, the slide mechanisms 220 and 320 may be configured to synchronize the timing of changing the mode of speed control of the substrate mounting stand 210 supporting the wafer 200 and the timing of changing the mode of speed control of the cartridge head mounting stand 310 supporting the cartridge head 300.

As used herein, the term synchronization means matching the timings of change. Specifically, the term synchronization means that when changing the modes of speed control such as acceleration, constant speed, and deceleration, the timings of change are matched for each of the wafer 200 and the cartridge head 300. However, the synchronization referred to herein includes a case where the timings of change are not completely matched but may be regarded as being matched. Furthermore, even in a case where the timings are different, when the respective timings have a close relationship based on a predetermined rule, such a case is included in the synchronization referred to herein. Examples of the close relationship include a relationship in which acceleration of one is completed until acceleration of the other is completed, a relationship in which acceleration of a faster one is completed until acceleration of a slower one is completed, and a relationship in which acceleration of the cartridge head 300 is completed until acceleration of the wafer 200 is completed.

When the timings of changes in the respective speed control modes are synchronized in this way, the reciprocating operation of the wafer 200 and the reciprocating operation of the cartridge head 300 are synchronized with each other in the relative position movement processing operation. Therefore, even when the wafer 200 and the cartridge head 300 reciprocate in opposite directions to each other, the reciprocating movement may be performed smoothly and efficiently. Moreover, generation of a useless movement range may be suppressed by the synchronization of the reciprocating operations, which may reduce the volume of the process container 101.

Hereinafter, the modes of speed control in the first period and the second period will be described with reference to specific examples.

In the first period, each of the wafer 200 and the cartridge head 300 is moved at a non-constant speed. That is, in the first period, the slide mechanism 220 moves the substrate mounting stand 210 supporting the wafer 200 at a non-constant speed. Further, in the first period, the slide mechanism 320 moves the cartridge head mounting stand 310 supporting the cartridge head 300 at a non-constant speed.

As used herein, the term "non-constant speed" means that the moving speed is not constant. Specifically, the term "non-constant speed" corresponds to, for example, acceleration or deceleration. In the case of acceleration or deceleration, a state of speed change (acceleration) may or may not be constant. However, the speed may not constantly change throughout the first period. For example, even in a case where the speed is temporarily constant, when the speed changes throughout the period, it may correspond to the "non-constant speed" referred to herein. Further, the term "non-constant speed" referred to herein may mainly refer to the relative speed between the wafer 200 and the cartridge head 300. In this case, when one of the wafer 200 and the cartridge head 300 is accelerating or decelerating, it may correspond to the non-constant speed referred to herein, even though the other has a constant speed.

By performing the non-constant speed movement in the first period as described above, the wafer 200 and the cartridge head 300 may be accelerated or decelerated without affecting the moving operation in the second period. Therefore, the movement of the wafer 200 and the cartridge head 300 at a desired speed in the second period may be ensured.

Further, the first period includes a period in which the wafer 200 and the cartridge head 300 move toward each other and a period in which the wafer 200 and the cartridge head 300 move away from each other. In such a first period, during the period in which the wafer 200 and the cartridge head 300 move toward each other, the slide mechanisms 220 and 320 accelerate the wafer 200 and the cartridge head 300. Further, in such a first period, during the period in which the wafer 200 and the cartridge head 300 move away from each other, the slide mechanisms 220 and 320 decelerate the wafer 200 and the cartridge head 300.

As described above, by accelerating the wafer 200 and the cartridge head 300 in the period of the first period in which the wafer 200 and the cartridge head 300 move toward each other and decelerating the wafer 200 and the cartridge head 300 in the period of the first period in which the wafer 200 and the cartridge head 300 move away from each other, the reciprocating movement may be performed smoothly and efficiently even when the wafer 200 and the cartridge head 300 are reciprocated in opposite directions. Moreover, since each of the wafer 200 and the cartridge head 300 is accelerated or decelerated in opposite directions to each other at the same time, the relative acceleration may be sufficiently increased without increasing the degree of each speed change (acceleration) excessively. It is possible to improve an efficiency of non-constant speed movement in the first period. Further, as the efficiency of non-constant speed movement is improved, it is possible to reduce the volume of the process container 101.

On the other hand, in the second period, for example, the wafer 200 and the cartridge head 300 are moved to keep the relative speed between the wafer 200 and the cartridge head 300 constant. That is, in the second period, the slide mechanisms 220 and 320 maintain a constant relative speed when the substrate mounting stand 210 supporting the wafer 200 and the cartridge head mounting stand 310 supporting the cartridge head 300 move respectively.

As used herein, the term "constant" means that the relative speed between the wafer 200 and the cartridge head 300 is kept at the same speed. However, the speed may not be exactly the same. For example, even when the speed fluctuates within a preset allowable range, the speed may be regarded as being "constant" referred to herein as long as it does not exceed the allowable range.

When the relative speed between the wafer 200 and the cartridge head 300 is maintained constant in the second period as described above, it is possible to suppress the fluctuation in the exposure amount of each gas in the plane of the wafer 200 when the wafer 200 passes directly under the cartridge head 300. Therefore, even when the wafer 200 and the cartridge head 300 are moved respectively, the exposure amount of each gas in the plane of the wafer 200 may be made uniform. As a result, it is possible to suppress the in-plane variation of the film-forming process, which may optimize the film-forming process performed in the second period.

For example, each of the wafer 200 and the cartridge head 300 may be moved at a constant speed to keep the relative speed between the wafer 200 and the cartridge head 300 constant. That is, in the second period, the slide mechanism 220 may be used to move the substrate mounting stand 210 supporting the wafer 200 at a constant speed. Further, in the second period, the slide mechanism 320 may be used to move the cartridge head mounting stand 310 supporting the cartridge head 300 at a constant speed.

As used herein, the term "constant speed" means that the moving speed is constant, that is, the moving speed is kept at the same speed value. However, the speed value may not be exactly the same. For example, even though the speed fluctuates within a preset allowable range, the speed may be regarded as being "constant" referred to herein as long as it does not exceed the allowable range. Further, the term "constant speed" referred to herein mainly refers to the moving speed of the wafer 200 or the cartridge head 300.

By moving the wafer 200 and the cartridge head 300 at a constant speed in this way, the relative speed between the wafer 200 and the cartridge head 300 may be kept constant in a very easy and reliable manner. Moreover, since each of the wafer 200 and the cartridge head 300 may be moved at a constant speed, the speed control is not complicated. Further, when the wafer 200 and the cartridge head 300 are moved at a constant speed, the exposure amount of each gas supplied from the cartridge head 300 to the surface of the wafer 200 becomes uniform in the plane of the wafer 200. Therefore, a film may be formed under the same conditions in the plane of the wafer 200.

When the wafer 200 and the cartridge head 300 are moved at a constant speed, the speed value when moving the wafer 200 and the speed value when moving the cartridge head 300 may be set to be equal to each other. In that case, in the second period, the slide mechanisms 220 and 320 make the moving speed of the substrate mounting stand 210 supporting the wafer 200 equal to the moving speed of the cartridge head mounting stand 310 supporting the cartridge head 300. Specifically, speed values of the substrate mounting stand 210 and the cartridge head mounting stand 310 are set to the same speed value or speed values that may be regarded as being the same in the range of, for example, 10 to 1000 mm/sec. This is useful in increasing the relative speed between the wafer 200 and the cartridge head 300, for example, when the diameter of the wafer 200 and the moving-direction width of the cartridge head 300 are equal to each other, which may expedite the film-forming process performed in the second period.

However, when the relative speed between the wafer 200 and the cartridge head 300 is maintained constant, the moving speeds of the wafer 200 and the cartridge head 300 may not be equal to each other and may be different from each other. In that case, the slide mechanisms 220 and 320 make the moving speed of the substrate mounting stand 210 supporting the wafer 200 and the moving speed of the cartridge head mounting stand 310 supporting the cartridge head 300 different from each other in the second period. Specifically, one of the wafer 200 and the cartridge head 300 is moved at a constant speed with a high-speed value, and the other is moved at a constant speed with a low-speed value. By doing so, for example, even when the diameter of the wafer 200 and the moving-direction width of the cartridge head 300 are different from each other in size, it is possible to maintain the relative speed between the wafer 200 and the cartridge head 300 constant while making the moving speeds thereof different according to the sizes of the wafer 200 and the cartridge head 300 respectively. That is, it becomes possible to flexibly deal with differences in the size and inertia of the moving parts, which may increase a versatility of the relative position moving processing operation.

The present disclosure is not limited to the case where in the second period, the relative speed between the wafer 200 and the cartridge head 300 is kept constant. For example, the relative speed between the wafer 200 and the cartridge head 300 may be changed during the second period. In that case, the slide mechanisms 220 and 320 change the relative speed between the substrate mounting stand 210 supporting the wafer 200 and the cartridge head mounting stand 310 supporting the cartridge head 300 when the substrate mounting stand 210 and the cartridge head mounting stand 310 move respectively during the second period.

The change in the relative speed between the wafer 200 and the cartridge head 300 during the second period may be performed, for example, by accelerating or decelerating the wafer 200 and moving the cartridge head 300 at a constant speed. Further, the change in the relative speed may be performed, for example, by moving the wafer 200 at a constant speed and accelerating or decelerating the cartridge head 300. In addition, the change in the relative speed may be performed, for example, by accelerating or decelerating the wafer 200 and accelerating or decelerating the cartridge head 300.

When the relative speed between the wafer 200 and the cartridge head 300 is changed during the second period as described above, for example, the relative speed may be made different according to the relative positions of the wafer 200 and the cartridge head 300 such that quality of the film obtained by the film-forming process becomes uniform in the plane of the wafer 200. Therefore, it becomes possible to flexibly deal with the film-forming process in various movement modes, which may optimize the film-forming process performed in the second period.

Examples of the relative speed change during the second period include the following examples. That is, in the second period, the relative speed between the wafer 200 and the cartridge head 300 is changed (made different) in the period in which a peripheral portion of the wafer 200 and the cartridge head 300 overlap each other in a plane view and the period in which a central portion of the wafer 200 and the cartridge head 300 overlap each other in the plane view. By doing so, for example, in the peripheral portion of the wafer 200, the film thickness may be increased by reducing the relative speed to increase the exposure amount of each gas, while in the central portion of the wafer 200, the film thickness may be decreased by increasing the relative speed to reduce the exposure amount of each gas. Conversely, for example, in the peripheral portion of the wafer 200, the film thickness may be decreased by increasing the relative speed to reduce the exposure amount of each gas, while in the central portion of the wafer 200, the film thickness may be increased by reducing the relative speed to increase the exposure amount of each gas. That is, it is possible to freely control the film thickness distribution in the plane of the wafer 200 of the film formed on the wafer 200. Further, it is also possible to freely control the film quality distribution in the plane of the wafer 200 of the film formed on the wafer 200. By changing the relative speed between the wafer 200 and the cartridge head 300 during the second period as described above, it is possible to freely regulate balance of the exposure amounts of each gas on the peripheral portion and the central portion in the plane of the wafer 200, which may alleviate the difference in film thickness and film quality between the peripheral portion and the central portion in the plane of the wafer 200, whereby the film quality (film thickness distribution or film quality distribution) may be made uniform in the plane of the wafer 200.

(4) Effect of the Embodiments

According to the embodiments, one or more of the following effects may be obtained.

(a) According to the embodiments of the present disclosure, the wafer 200 and the cartridge head 300 reciprocate in opposite directions to each other. Therefore, as compared with the case where one of the wafer 200 and the cartridge head 300 is linearly moved, it is possible to reduce the movement range L1 when performing the relative position movement. Therefore, it is possible to reduce the volume of the process container 101 and to reduce the footprint of the substrate processing apparatus 100 accordingly. Specifically, for example, when the movement range L1 when performing the relative position movement as in the embodiments and the movement ranges L2 and L3 when linearly moving one of the wafer 200 and the cartridge head 300 are calculated and compared with one another (see FIGS. 5A to 5C), the movement range L1 may be reduced by about 30 to 40% as compared with the movement ranges L2 and L3. As a result, it is possible to improve the productivity per unit area of the substrate processing apparatus 100.

(b) According to the embodiments of the present disclosure, in the relative position movement processing operation for the wafer 200 and the cartridge head 300, different modes of speed control are performed in the first period and the second period. Therefore, even when the wafer 200 and the cartridge head 300 reciprocate in opposite directions to each other, the reciprocating movement may be performed smoothly and efficiently. Moreover, since the speed fluctuation in the first period does not affect the moving speed in the second period, the film-forming process may be optimized.

(c) According to the embodiments of the present disclosure, in the relative position movement processing operation for the wafer 200 and the cartridge head 300, when changing the speed control mode in the first period and the second period, the timing of the change in the speed control mode for the wafer 200 is synchronized with the timing of the change in the speed control mode for the cartridge head 300, whereby the respective reciprocating operations are performed in synchronization with each other. Therefore, even when the wafer 200 and the cartridge head 300 reciprocate in opposite directions to each other, the reciprocating movement may be performed smoothly and efficiently. Moreover, generation of a useless movement range may be suppressed by the synchronization of the reciprocating operations, which may reduce the volume of the process container 101.

(d) According to the embodiments of the present disclosure, by maintaining the relative speed between the wafer 200 and the cartridge head 300 constant in the second period of the relative position movement processing operation between the wafer 200 and the cartridge head 300, it is possible to suppress the fluctuation in the exposure amount of each gas in the plane of the wafer 200 when the wafer 200 passes directly under the cartridge head 300. Therefore, even when the wafer 200 and the cartridge head 300 are moved respectively, the exposure amount of each gas in the plane of the wafer 200 may be made uniform. As a result, it is possible to suppress the in-plane variation of the film-forming process, which may optimize the film-forming process performed in the second period.

(e) According to the embodiments of the present disclosure, in the second period of the relative position movement processing operation between the wafer 200 and the cartridge head 300, the relative speed between the wafer 200 and the cartridge head 300 is changed during the second period. By doing so, it is possible to make the relative speed different according to the relative positions of the wafer 200 and the cartridge head 300 such that the quality of the film obtained by the film-forming process becomes uniform in the plane of the wafer 200. Therefore, it becomes possible to flexibly deal with the film-forming process in various movement modes, which may optimize the film-forming process performed in the second period.

(f) According to the embodiments of the present disclosure, the cartridge head 300 includes the precursor gas cartridge 330 and the reaction gas cartridges 340, and the reaction gas cartridges 340 are arranged such that the reaction gas cartridges 340 sandwich the precursor gas cartridge 330 on both sides thereof. Therefore, in a cyclic processing process, it is possible to perform an appropriate film-forming process by separating the precursor gas and the reaction gas. Specifically, the embodiments of the present disclosure may appropriately apply to a case where the wafer 200 and the cartridge head 300 reciprocate in opposite directions to each other. Even when the wafer 200 and the cartridge head 300 reciprocate in opposite directions to each other, the wafer is finally exposed to the gas supplied from the reaction gas cartridge 340 to complete the film-forming process, which may optimize the film-forming process.

(g) According to the embodiments of the present disclosure, when the cartridge head 300 and the wafer 200 reach one end side or the other end side and turn back in the process container 101, the surface of the wafer 200 may be exposed to the $NH_3$ gas as the reaction gas twice in succession and may be subjected to a nitriding process twice in succession. The exposure of the surface of the wafer 200 to the $NH_3$ gas may generate HCl, and the HCl thus generated may fill the adsorption sites and make it difficult for the above-described reaction to proceed. However, even in that case, according to the embodiments of the present disclosure, the surface of the wafer 200 may be subjected to the nitriding process twice in succession. Therefore, at the second nitriding process on the surface of the wafer 200, it is possible to remove the HCl that fills the adsorption sites. As a result, the adsorption sites may be optimized for each cycle, and the above-mentioned reaction may appropriately proceed. Further, in the process of forming the TiN film, Cl may remain in the TiN layer formed on the surface of the wafer 200. Even in this case, Cl remaining in the TiN layer may be sufficiently removed by the nitriding process performed twice in succession. This makes it possible to form a TiN film of an extremely low Cl concentration.

(h) According to the embodiments of the present disclosure, the substrate processing apparatus further includes the second gas supplier and the second gas exhauster configured to perform the gas supply to the inside of the process container 101 and the gas exhaust from the inside of the process container 101 separately from the first gas supplier and the first exhauster connected to the cartridge head 300. Therefore, the pressure control in the process container 101 may be freely performed independently of the pressure control performed in the cartridge head 300, which may optimize the film-forming process performed in the process container 101.

Second Embodiment

Next, the second embodiment of the present disclosure will be specifically described. Here, the differences from the first embodiment will be mainly described, and the description of other points will be omitted.

FIGS. 6A to 6C are conceptual views showing an example of wafer arrangement in a substrate processing apparatus used in the second embodiment of the present disclosure, wherein FIG. 6A is a plane view showing a configuration example in which a single wafer is processed, FIG. 6B is a plane view showing a configuration example in which two wafers are processed at the same time, and FIG. 6C is a plane view showing a configuration example in which four wafers are processed at the same time.

In the first embodiment of the present disclosure described above, the case where the substrate mounting stand 210 in the process container 101 supports one wafer 200 as shown in FIG. 6A has been described as an example. In the second embodiment of the present disclosure, as shown in FIG. 6B or 6C, the substrate mounting stand 210 is configured to support a plurality of wafers 200.

Specifically, in the substrate processing apparatus 100 as an example of the second embodiment, as shown in FIG. 6B, two wafers 200 are placed on the substrate mounting stand 210 and are simultaneously processed. At this time, when the two wafers 200 are arranged side by side along the direction orthogonal to the reciprocating movement direction of the substrate mounting stand 210 as shown in FIG. 6B, the movement range L1 of the relative position movement may be suppressed to the same level as in the case of one wafer 200.

Further, in the substrate processing apparatus 100 as another example of the second embodiment of the present disclosure, as shown in FIG. 6C, four wafers 200 are mounted on the substrate mounting stand 210 and are simultaneously processed. At this time, as shown in FIG. 6C, when the four wafers 200 are arranged side by side in two rows and two columns in the plane view, it is possible to suppress an increase in the formation width in the direction orthogonal to the reciprocating movement direction of the cartridge head 300 while suppressing the increase in the movement range L1 of the relative position movement.

As described above, according to the second embodiment of the present disclosure, two or more wafers 200, for example, two or four wafers 200, are mounted on the substrate mounting stand 210 and are simultaneously processed. Therefore, it is possible to improve the processing productivity of the wafers 200, which may improve the processing throughput in the substrate processing apparatus 100.

In the present embodiment, the case where the plurality of wafers 200 are two or four wafers has been taken as an example. However, the number of wafers 200 to be processed at the same time may be two or more and is not particularly limited. In addition, the number of wafers 200 may be an odd number as well as an even number.

Third Embodiment

Next, a third embodiment of the present disclosure will be specifically described. Here, the differences from the above described first embodiment will be mainly described, and the description of other points will be omitted.

Figure 7A:
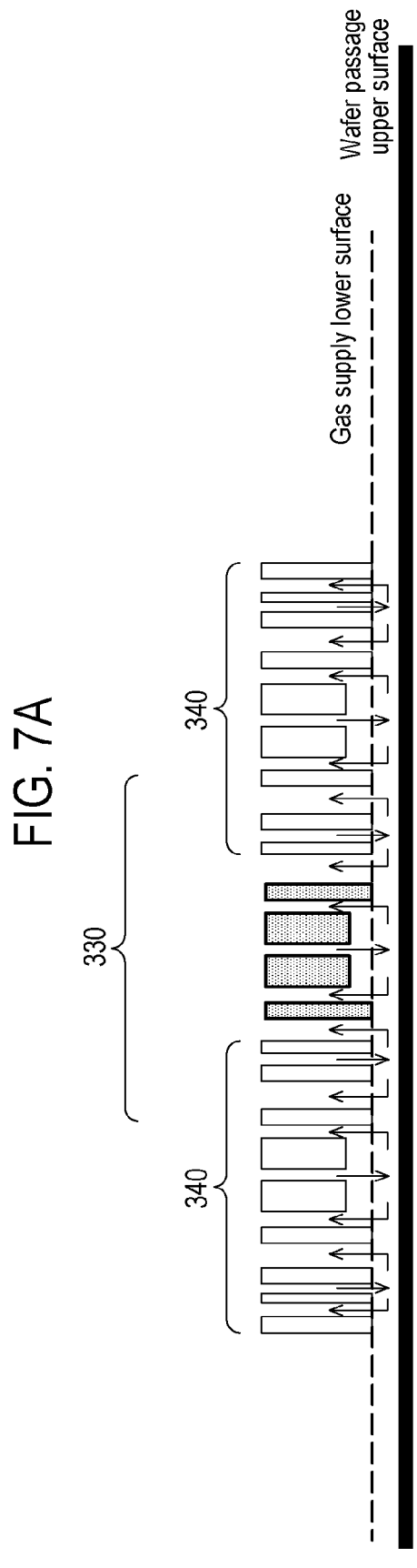
Figure 7B:
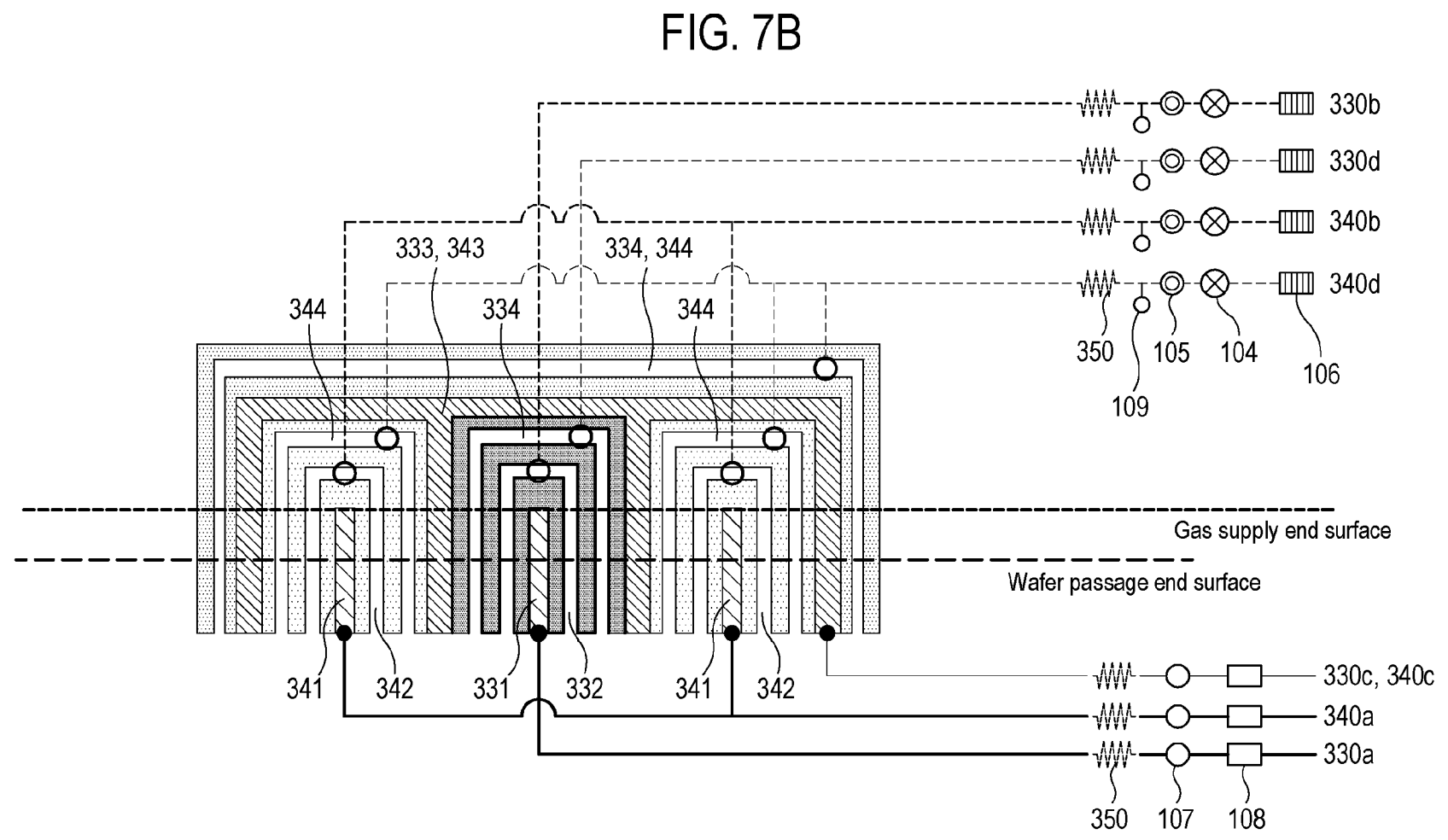

In the third embodiment of the present disclosure, the configuration of the cartridge head 300 is different from that of the first embodiment. FIGS. 7A and 7B are conceptual views showing a gas cartridge head assembly of a substrate processing apparatus used in the third embodiment of the present disclosure, wherein FIG. 7A is a side sectional view schematically showing an outline of a configuration example, and FIG. 7B is a cross sectional view showing a cross section of a main component.

As shown in FIGS. 7A and 7B, the cartridge head 300 given as an example herein allows the precursor gas cartridge 330 and the reaction gas cartridge 340 to share the inert gas suppliers 333 and 343 and the inert gas exhausters 334 and 344 installed at the outer periphery of the inert gas suppliers 333 and 343.

For example, in the case of the cartridge head 300 of the configuration shown in FIGS. 7A and 7B, the cartridge head 300 passes in one direction. Therefore, an order of gas supply/exhaust processing operations performed on the wafer 200 is as follows.

27

(V) $N_2$ (V)→(V) $NH_3$ (V)→(V) $N_2$ (V)→(V) $TiCl_4$ (V)→(V) $N_2$ (V)→(V) $NH_3$ (V)→(V) $N_2$ (V)

Further, when focusing on the precursor gas and the reaction gas and a reciprocating path, the surface of the wafer 200 is exposed to various gases in the following order.

$NH_3$→$TiCl_4$→$NH_3$→$NH_3$→$TiCl_4$→$NH_3$

As described above, according to the third embodiment of the present disclosure, by sharing the inert gas suppliers 333 and 343 and the inert gas exhausters 334 and 344, apparatus manufacturing cost may be reduced by downsizing the cartridge head 300 and reducing the number of components. Moreover, it is possible to perform the film-forming process on the wafer 200 in the same manner as the first embodiment while making it possible to reduce the size of the cartridge head 300. Therefore, in addition to the effects obtained in the first embodiment, it is also possible to obtain the effect of downsizing the cartridge head 300 and the like, which makes it possible to further reduce the volume of the process container 101.

Other Embodiments

Although the first to third embodiments of the present disclosure have been specifically described above, the present disclosure is not limited to each of the above-described embodiments. Various changes may be made without departing from the gist thereof.

For example, in each of the above-described embodiments of the present disclosure, there has been described the example in which the TiN film is formed on the wafer 200. However, the present disclosure may be applied to a case of forming, in addition to the TiN film, for example, a conductive metal element-containing film (metal nitride film) such as a WN film or the like, an insulating metal element-containing film (metal oxide film or high-dielectric constant insulating film) such as a TiO film, an AlO film, a HfO film, a ZrO film or the like, an insulating semi-metal element-containing film (silicon insulating film) such as a SiN film, a SiO film or the like, and so forth. In addition, the present disclosure may be applied to a case of forming a three-element-based film or a four-element-based film as well as the case of forming these two-element-based films.

Further, in each of the above-described embodiments, the film-forming process has been taken as an example of the process performed on the wafer. However, the present disclosure is not limited thereto. The present disclosure may be applied to other processes such as oxidation, nitriding, diffusion, annealing, etching, pre-cleaning, chamber cleaning and the like.

According to the present disclosure in some embodiments of the present disclosure, it is possible to reduce a volume of a process container and a footprint of a substrate processing apparatus.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

28

What is claimed is:

1. A substrate processing apparatus, comprising:
a process container in which a substrate to be processed is processed;
a support configured to support the substrate to be processed in the process container;
a gas flow controller configured to form a gas flow capable of making contact with the substrate to be processed in the process container;
a first actuator configured to allow the support to reciprocate in the process container;
a second actuator configured to allow the gas flow controller to reciprocate in the process container in a direction opposite to a moving direction of the support,
wherein each of the first actuator and the second actuator is fixed to a bottom of the process container; and
a controller configured to be capable of controlling the first actuator and the second actuator to:
(a) accelerate the support supporting the substrate to be processed and the gas flow controller, when the support supporting the substrate to be processed and the gas flow controller move toward each other during a first period in which the substrate to be processed that is supported by the support and the gas flow controller do not overlap with each other in a plane view;
(b) maintain a relative speed between the support supporting the substrate to be processed and the gas flow controller to be constant, during a second period in which the substrate to be processed that is supported by the support and the gas flow controller at least partially overlap with each other in the plane view, after (a); and
(c) decelerate the support supporting the substrate to be processed and the gas flow controller, when the support supporting the substrate to be processed and the gas flow controller move away from each other during the first period, after (b).

2. The substrate processing apparatus of claim 1, wherein the first actuator is configured to allow the support to reciprocate between one end side and the other end side in the process container, and
wherein the second actuator is configured to allow the gas flow controller to reciprocate between the other end side and the one end side in the process container.

3. The substrate processing apparatus of claim 2, wherein the first actuator and the second actuator are configured to locate the gas flow controller on the other end side when the support is located on the one end side, and locate the support on the other side when the gas flow controller is located on the one end side.

4. The substrate processing apparatus of claim 2, wherein the process container is configured such that a distance between one end side and the other end side in the process container is less than a sum of twice the diameter of the substrate to be processed and a moving-direction width of the gas flow controller, or less than a sum of twice the moving-direction width of the gas flow controller and the diameter of the substrate to be processed.

5. The substrate processing apparatus of claim 1, wherein the first actuator and the second actuator are configured to synchronize a timing of changing a mode of speed control on the support supporting the substrate to be processed and a timing of changing the mode of speed control on the gas flow controller.

6. The substrate processing apparatus of claim 1, wherein the first actuator and the second actuator are configured to move each of the support supporting the substrate to be processed and the gas flow controller at a constant speed during the second period.

7. The substrate processing apparatus of claim 6, wherein the first actuator and the second actuator are configured to make a moving speed of the support supporting the substrate to be processed equal to a moving speed of the gas flow controller during the second period.

8. The substrate processing apparatus of claim 6, wherein the first actuator and the second actuator are configured to make a moving speed of the support supporting the substrate to be processed different from a moving speed of the gas flow controller during the second period.

9. The substrate processing apparatus of claim 1, wherein the first actuator and the second actuator are configured to change the relative speed between the support supporting the substrate to be processed and the gas flow controller during the second period.

10. The substrate processing apparatus of claim 1, wherein the first actuator and the second actuator are configured to change the relative speed between the support supporting the substrate to be processed and the gas flow controller in a period of the second period in which a peripheral portion of the substrate to be processed that is supported by the support and the gas flow controller overlap with each other in the plane view and a period of the second period in which a central portion of the substrate to be processed that is supported by the support and the gas flow controller overlap with each other in the plane view.

11. The substrate processing apparatus of claim 1, wherein the first actuator and the second actuator are configured to allow the support supporting the substrate to be processed and the gas flow controller to reciprocate while maintaining a state in which the substrate to be processed that is supported by the support and the gas flow controller at least partially overlap with each other in the plane view.

12. The substrate processing apparatus of claim 1, wherein the gas flow controller includes a precursor gas flow controller and reaction gas flow controllers, and wherein the reaction gas flow controllers are arranged to sandwich the precursor gas flow controller from both sides in a moving direction of the gas flow controller.

13. The substrate processing apparatus of claim 12, wherein the precursor gas flow controller includes a precursor gas supplier, a precursor gas exhauster installed at an outer periphery of the precursor gas supplier, an inert gas supplier installed at an outer periphery of the precursor gas exhauster, and inert gas exhausters installed at inner and outer peripheries of the inert gas supplier, and wherein each of the reaction gas flow controllers includes a reaction gas supplier, a reaction gas exhauster installed at an outer periphery of the reaction gas supplier, an inert gas supplier installed at an outer periphery of the reaction gas exhauster, and inert gas exhausters installed at inner and outer peripheries of the inert gas supplier.

14. The substrate processing apparatus of claim 1, wherein the gas flow controller includes a first gas supplier and a first exhauster, and wherein the gas flow controller further includes a second gas supplier and a second exhauster installed separately from the first gas supplier and the first exhauster and configured to perform gas supply to an inside of the process container and gas exhaust from the inside of the process container.

15. The substrate processing apparatus of claim 1, further comprising:

a mounting stand configured to support the gas flow controller and connected to the second actuator, wherein a width of the mounting stand is larger than a width of the support supporting the substrate to be processed in the plane view.

16. A method of manufacturing a semiconductor device, comprising:

supporting a substrate by a support in a process container;

forming a gas flow capable of making contact with the substrate by a gas flow controller in the process container;

processing the substrate by allowing the support supporting the substrate to reciprocate in the process container by a first actuator and allowing the gas flow controller having formed the gas flow to reciprocate in the process container in a direction opposite to a moving direction of the support by a second actuator, wherein each of the first actuator and the second actuator is fixed to a bottom of the process container; and controlling the first actuator and the second actuator, by a controller, to:

(a) accelerate the support supporting the substrate and the gas flow controller, when the support supporting the substrate and the gas flow controller move toward each other during a first period in which the substrate supported by the support and the gas flow controller do not overlap with each other in a plane view;

(b) maintain a relative speed between the support supporting the substrate and the gas flow controller to be constant, during a second period in which the substrate supported by the support and the gas flow controller at least partially overlap with each other in the plane view, after (a); and (c) decelerate the support supporting the substrate and the gas flow controller, when the support supporting the substrate and the gas flow controller move away from each other during the first period, after (b).

17. A non-transitory computer-readable recording medium storing a program that causes, by a computer, a substrate processing apparatus to perform a process comprising:

supporting a substrate by a support in a process container of the substrate processing apparatus;

forming a gas flow capable of making contact with the substrate by a gas flow controller in the process container;

processing the substrate by allowing the support supporting the substrate to reciprocate in the process container by a first actuator and allowing the gas flow controller having formed the gas flow to reciprocate in the process container in a direction opposite to a moving direction of the support by a second actuator, wherein each of the first actuator and the second actuator is fixed to a bottom of the process container; and controlling the first actuator and the second actuator, by a controller, to:

(a) accelerate the support supporting the substrate and the gas flow controller, when the support supporting the substrate and the gas flow controller move toward each other during a first period in which the substrate supported by the support and the gas flow controller do not overlap with each other in a plane view;

(b) maintain a relative speed between the support supporting the substrate and the gas flow controller to be constant, during a second period in which the substrate supported by the support and the gas flow controller at least partially overlap with each other in the plane view, after (a); and (c) decelerate the support supporting the substrate and the gas flow controller, when the support supporting the substrate and the gas flow controller move away from each other during the first period, after (b).

* * * * *